(12) United States Patent
Hurwitz et al.

(10) Patent No.: US 8,238,845 B2
(45) Date of Patent: Aug. 7, 2012

(54) RADIO FREQUENCY CIRCUIT

(75) Inventors: Jonathan Ephraim David Hurwitz, Edinburgh (GB); Steven Collins, Edinburgh (GB)

(73) Assignee: Broadcom Europe Limited, London (GB)

( * ) Notice: Subject to any disclaimer, the term of this patent is extended or adjusted under 35 U.S.C. 154(b) by 361 days.

(21) Appl. No.: 12/564,810

(22) Filed: Sep. 22, 2009

(65) Prior Publication Data
US 2011/0069777 A1    Mar. 24, 2011

(51) Int. Cl.
*H04B 1/02* (2006.01)
(52) U.S. Cl. .......... 455/91; 455/104; 455/105; 455/112; 455/113; 341/143; 341/150
(58) Field of Classification Search ............ 455/91, 455/104, 105, 112, 113, 118, 119, 120; 341/143, 341/150
See application file for complete search history.

(56) References Cited

U.S. PATENT DOCUMENTS

| | | |
|---|---|---|
| 2005/0181754 A1 | 8/2005 | Wu et al. |
| 2008/0311860 A1 | 12/2008 | Tanaka et al. |
| 2009/0010310 A1 | 1/2009 | Rofougaran et al. |
| 2009/0066552 A1* | 3/2009 | Quinn et al. ............ 341/150 |
| 2010/0158154 A1* | 6/2010 | Kang et al. ............ 375/296 |

OTHER PUBLICATIONS

International Search Report and Written Opinion: PCT/US2010/049184 dated Nov. 8, 2010.

* cited by examiner

*Primary Examiner* — Tuan Pham
(74) *Attorney, Agent, or Firm* — Garlick & Markison; Bruce E. Garlick

(57) ABSTRACT

A digital-to-analog conversion circuit operates by selectively discharging members of a plurality of capacitors. Charging of the capacitors occurs during a reset period while digital-to-analog conversion occurs as the capacitors are discharged. Those capacitors that are discharged are selected from the plurality of capacitors based on a digital input. The analog output includes the charge discharged from the capacitors. The capacitors are optionally divided into separate capacitor banks.

20 Claims, 19 Drawing Sheets

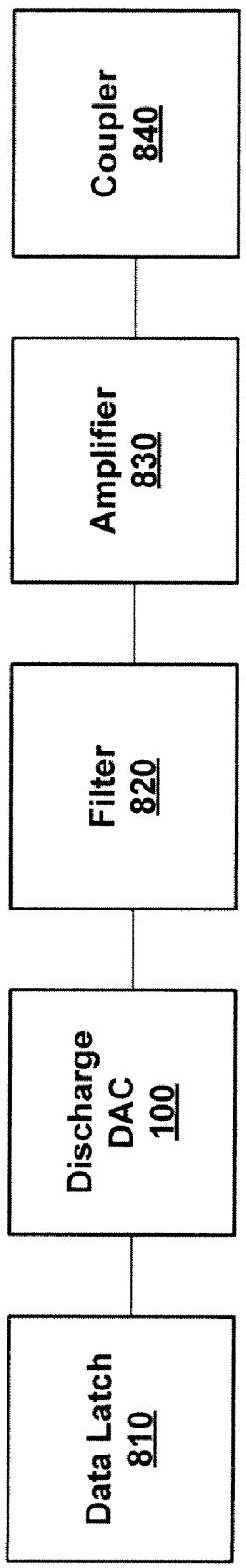
FIG. 8
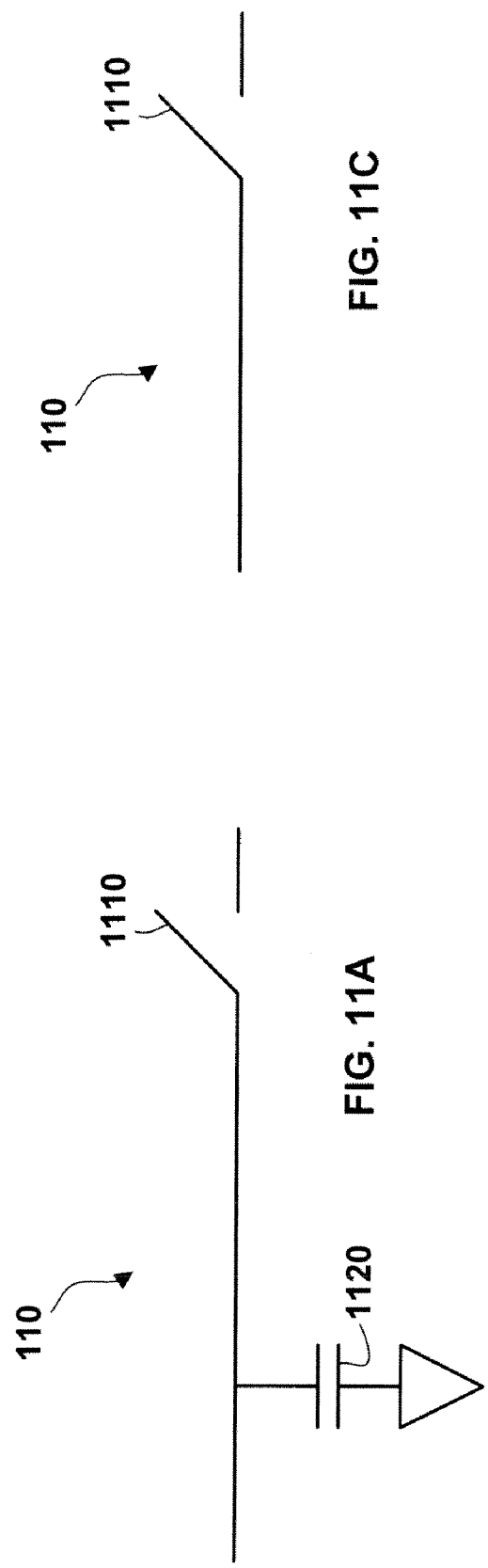
FIG. 11C
FIG. 11A

RADIO FREQUENCY CIRCUIT

BACKGROUND

1. Field of the Invention

The invention is in the field of electronics and more specifically in the field of digital-to-analog converters.

2. Related Art

There are a variety of digital-to-analog converters. In one type of digital-to-analog converter a single capacitor is charged using a plurality of digitally switched current inputs. Each of the current inputs is configured to supply a share of a charging current. The amount of charging is dependent on the current or voltage sources, on the settings of the switches and, thus, the digital values used to control the switches. Charging is continued for a fixed time or until a threshold voltage is reached. For example, if the charging is continued for a fixed time then the resulting charge on the capacitor is used to produce an analog voltage or current.

The accuracy of this type of digital-to-analog converter is, in part, dependant on the accuracy of the current or voltage sources and/or timing elements. The precision of this type of digital-to-analog converter is dependant, in part, on the number of current input switches and/or the length of the measured time period.

BRIEF DESCRIPTION OF THE DRAWINGS

FIG. 8 illustrates a transmitter system, according to various embodiments of the invention.

FIG. 11A-11C illustrate alternative output circuits, according to various embodiments of the invention.

SUMMARY

Figure 1:
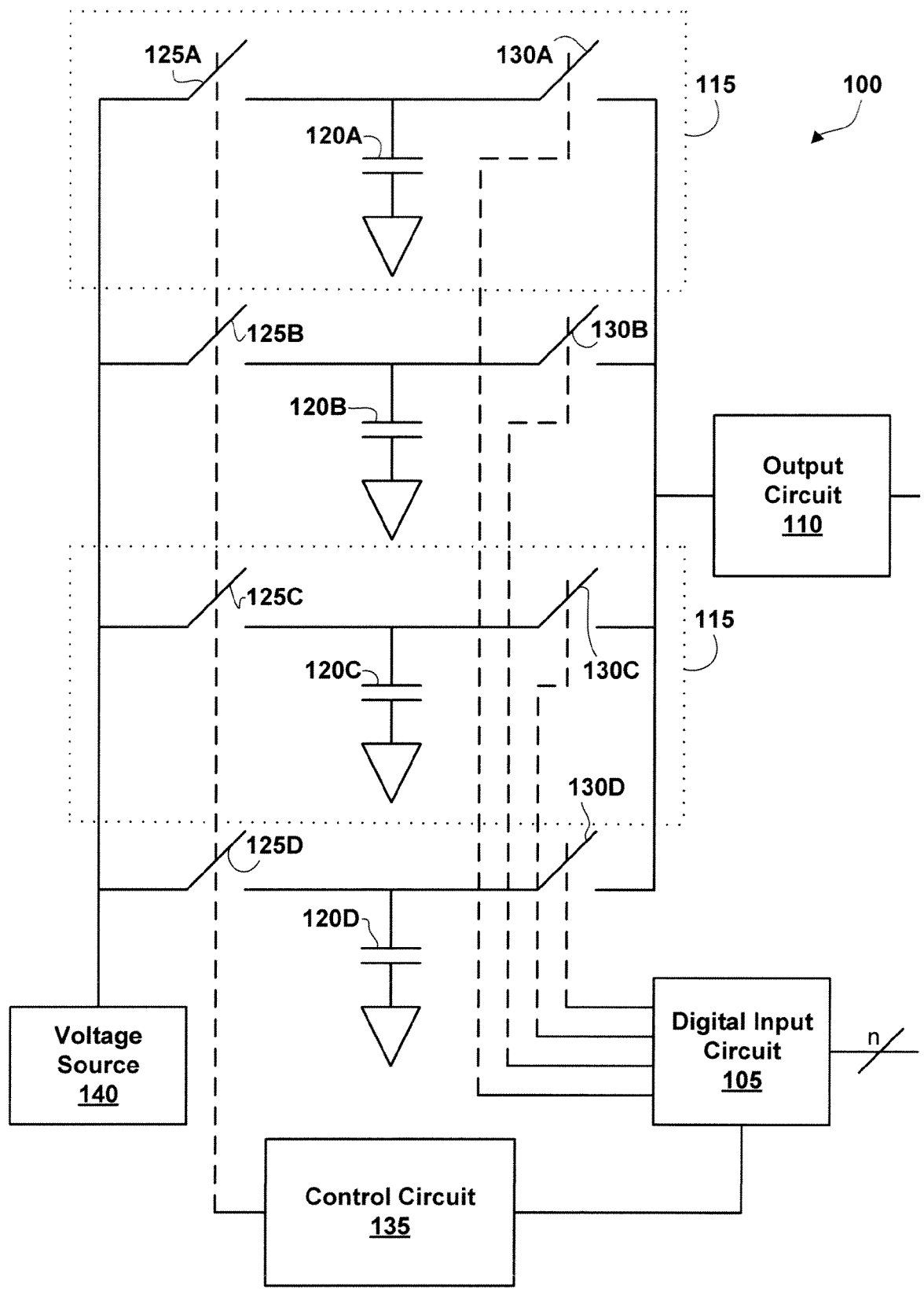
FIG. 1 illustrates a digital-to-analog circuit, according to various embodiments of the invention.

The invention includes a digital-to-analog converter in which the discharge of a plurality of capacitors is used to produce an analog charge output. Either the charging or discharging of the plurality of capacitors is digitally controlled. For example, in various embodiments, each of these capacitors is first charged to one or more predetermined voltages. After charging, the charging source is electrically decoupled from the plurality of capacitors. Switches are then set responsive to a digital input to discharge a selected subset of the plurality of capacitors. The identities of the capacitors included in the subset of the plurality of capacitors are dependent on the digital input. The analog power (e.g., charge and current) of the discharge is, thus, a function of the digital input. Alternatively, switches are used to charge only a subset of the plurality of capacitor responsive to the digital input. The charged capacitors are discharged and the analog power of the discharge is, thus, a function of the digital input.

The output of the digital-to-analog converter is optionally coupled to a low impedance load such as a power amplifier, transformer, current copier, antenna, or the like. This load may be part of a communication medium, e.g., a wire or wireless medium. The digital-to-analog converter of the invention is optionally configured to operate at radio frequencies.

In some embodiments, the digital-to-analog converter includes a summing capacitor configured to collect the charge from the subset of selectively charged or discharged capacitors and then provide the collected charge as the analog output of the digital-to-analog converter. Use of the summing capacitor provides for an RC time constant of the analog output that is independent of the digital input.

Various embodiments if the invention include a digital-to-analog converter comprising: a plurality of capacitors; one or more voltage sources configured for recharging the plurality of capacitors; a plurality of recharge switches disposed between the one or more voltage sources and the plurality of capacitors, each of the plurality of recharge switches being configured to control recharging of one of the plurality of capacitors, respectively; a plurality of discharge switches each respectively configured to discharge one of the plurality of capacitors to produce a differential analog output; and a control circuit configured to select which of the plurality of capacitors to charge and discharge using one or more of the plurality of discharge switches or one or more of the plurality of recharge switches, the selection being based on the value of a digital input and the analog output including a pulse of charge representative of the digital input.

Various embodiments of the invention include a digital-to-analog converter comprising: a first capacitor; a second capacitor; one or more voltage sources configured to charge the first capacitor and the second capacitor; a first recharge switch disposed between the first capacitor and the one or more voltage sources; a second recharge switch disposed between the second capacitor and the one or more voltage sources; a first discharge switch configured to discharge the first capacitor; a second discharge switch configured to discharge the second capacitor; and an output circuit configured to receive the discharge of the first capacitor through the first discharge switch, to receive the discharge of the second capacitor through the second discharge switch, and to provide a combination of charge discharged from the first capacitor and charge discharged from the second capacitor as a differential analog output pulse of the digital-to-analog converter.

Various embodiments of the invention include a radio frequency transmitter comprising: a data latch configured to receive a digital data signal in a first frequency band; a digital-to-analog converter configured to receive the digital data signal from the data latch and to generate a differential output signal modulated to form a second frequency of at least 0.8 GHz, the output signal comprising a series of pulses including charge representative of the digital data; a band selection filter configured to receive the output signal of the digital-to-analog converter; an amplifier configured to amplify the output signal of the digital-to-analog converter; and a coupler configured to receive the output signal of the digital-to-analog converter and to couple this output signal to a communication medium at the second frequency.

Various embodiments of the invention include a method of converting a digital input signal to an analog output signal, the method comprising: receiving the digital signal including at least two bits; charging both a first capacitor and a second capacitor at the same time using one or more voltage sources; opening a first recharge switch to electrically disconnect the first capacitor from the one or more voltage sources; opening a second recharge switch to electrically disconnect the first capacitor from the one or more voltage sources; setting a first discharge switch configured to control discharge of the first capacitor; setting a second discharge switch configured to control discharge of the second capacitor, wherein charging of the first and second capacitor or setting of the first and second discharge switches is responsive to the two bits; and providing a charge pulse through the first discharge switch and the second discharge switch, the analog output being differential and including charge discharged from the first capacitor and the second capacitor.

Various embodiments of the invention include a sideband suppression system comprising: a clock configured to provide a clock signal; an I/Q data latch configured to receive digital input data and provide an "I" signal and a "Q" signal representative of the digital input data; a phase shifter configured to produce a phase shifted copy of the clock signal; a first differential digital-to-analog converter configured to receive the "I" signal and the clock signal, and to produce a first analog output including two sidebands of the "I" signal around a sampling frequency of the first digital-to-analog converter; a second differential digital-to-analog converter configured to receive the "Q" signal and the phase shifted copy of the clock signal, and to produce a second analog output including two sidebands of the "Q" signal around a sampling frequency of the second digital-to-analog converter; and a load circuit configured to combine the first and second analog outputs so as to produce a single sideband output.

Various embodiments of the invention include a sideband suppression system comprising: a clock configured to provide a clock signal; an I/Q data latch configured to receive digital input data and provide an "I" signal and a "Q" signal; a multiplexer configured to multiplex the "I" and "Q" signals; a binary negator configured to negate an output of the multiplexer output on every other cycle of the clock signal; a differential digital-to-analog converter configured to receive an output of the binary negator and produce an analog charge pulse output representative of the digital input data, the analog charge pulse output including a single sideband of the clock signal, a second sideband being suppressed; and a load circuit configured to receive the analog charge pulse output.

DETAILED DESCRIPTION

In contrast with some systems of the prior art, wherein charging of a capacitor is used to convert a digital input to an analog output, various embodiments of the invention comprise selective discharging of a plurality of capacitors to generate an analog output. This approach provides a number of advantages. As is further shown elsewhere herein, the approach of selectively discharging different capacitors can be implemented using a variety of alternative circuits. Because the system can be configured such that the time required to perform the discharge process is shorter than the time required to charge the capacitors, the frequency of the digital-to-analog conversion can be less dependent on the RC time constant of the charging process relative to systems of the prior art. In various embodiments, the digital-to-analog circuit of the invention is implemented in CMOS technology and/or is configured to provide an analog output at a frequency of at least 1, 1.5, 2, 2.2, 5, 10 or 50 GHz. The frequency of the output signal can be 2, 5, 10, 50 or 100 times greater than a frequency or frequency band at which the digital input is received. For example, in one embodiment data is received at approximately 200 MHz while the output frequency is approximately 2.2 GHz. In other embodiments, the output frequency is above 800 MHz, above 1.5 GHz, above 2.0 GHz, or between approximately 2.0 and 2.2 GHz. In some embodiments, the output frequency is one or more frequency range typically used for prior art digital broadcast such as cable television, satellite television, wireless communication, or the like. The output frequency may be in the ranges 800 MHz-1200 MHz, 1500 MHz-2 GHz, or 2.2 GHz-2.8 GHz. The output frequency optionally includes a frequency band at least 50 Mhz, 100 Mhz, 200 MHz or 250 MHz in width. The output may include one or two sidebands of a sampling frequency of the digital to analog converter. (The output frequency discussed herein is the frequency at which output pulses are generated, e.g., one over the period between pulses, and not frequency components that ay be found within the pulses.) The sampling frequency of the digital-to-analog converter is optionally between 700 MHz and 3.2 GHz depending on the digital baseband and technique used for generating a sideband.

FIG. 1 illustrates a Digital-to-Analog Circuit 100, according to various embodiments of the invention. Digital-to-Analog Circuit 100 is configured to receive an n bit digital signal at a Digital Input Circuit 105 and to generate a responsive analog signal at an Output Circuit 110. Digital-to-Analog Circuit 100 includes a plurality of Unit Cells 115 each comprising at least one Capacitor 120, individually labeled 120A, 120B, etc. Each Unit Cell 115 further comprises a Recharge Switch 125 and a Discharge Switch 130, individually labeled 125A, 125B . . . and 130A, 130B . . . , respectively. Recharge Switches 125 are controlled by a Control Circuit 135, while switches 130 are controlled by Digital Input Circuit 105 and Control Circuit 135. One side of each of Capacitors 120 is coupled to respective members of Recharge Switches 125 and 130 while the other side is typically coupled to a fixed voltage such as ground or common. Recharge Switches 125 are disposed between one or more Voltage Sources 140 and Capacitors 120 are each configured to control recharging of one of the plurality of Capacitors 120. Discharge Switches 130 are disposed between Capacitors 120 and Output Circuit 110 and are each configured to control discharging of one of Capacitors 120 by selectively opening and closing responsive to a digital input. Digital Input Circuit 105 is optionally considered part of Control Circuit 135.

Voltage Source 140 is configured to charge Capacitors 120 when Recharge Switches 125 are in a closed position. Voltage Source 140 may include a single device, e.g. a high current power supply, configured to provide current to several or all of Recharge Switches 125. Alternatively, Voltage Source 140 may include several devices each connected to provide current to a different member of Recharge Switches 125. In some embodiments, Voltage Source 140, Recharge Switches 125 and Capacitors 120 are configured to minimize the RC time constant associated with charging Capacitors 120 while Recharge Switches 125 are in a closed state.

Recharge Switches 125 and Discharge Switches 130 are typically solid state switches, e.g., transistors. However, in alternative embodiments Recharge Switches 125 and/or Discharge Switches 130 include electrically or magnetically actuated mechanical devices. In some embodiments, Recharge Switches 125 and Discharge Switches 130 are included in a multi-pole switch. In these embodiments, a first pole position is configured to electrically couple one of Capacitors 120 to Voltage Source 140 and a second pole position is configured to electrically couple the same Capacitor 120 to Output Circuit 110.

Control Circuit 135 is configured to electrically control the state of Recharge Switches 125A-125D and thereby control the charging of Capacitors 120. Control Circuit 135 is also configured to control the state of Discharge Switches 130 via Digital Input Circuit 105. For example, Control Circuit 135 is configured to close Recharge Switches 125 during a recharge period and to close members Discharge Switches 130 during a conversion period. During the recharge period Discharge Switches 130 are in the open state and during the conversion period Recharge Switches 120 are typically in the open state. Control Circuit 135 typically includes a timing circuit configured to time the changes between the recharge periods and the conversion period.

During the conversion period Digital Input Circuit 105 is configured to determine which members of Discharge Switches 130 are placed in the closed (conducting) state and which are placed in the open state. Those switches in the closed state allow charge on the member of Capacitors 120 within the same Unit Cell 115 to be discharged to Output Circuit 110. In some embodiments, Digital input Circuit 105 includes a set of voltage followers each configured to receive one bit of the digital input signal to be converted to an analog signal. These voltage followers drive the changes in the inputs of Discharge Switches 130 that control the switch states. One or more signals from Control Circuit 135 are used to determine at what times the digital input signal is used to set the states of Discharge Switches 130.

Output Circuit 110 is configured to receive the discharge of a set of Capacitors 120 and to provide a resulting output. Which members of Capacitors 120 are included in this set is responsive to the states of Discharge Switches 130 and, thus, responsive to the digital input to Digital Input Circuit 105. Output Circuit 110 typically receives discharge from several of Capacitors 120 at the same time, e.g., in a conversion period. These discharges are combined and used to provide an output. For example, in one instance Output Circuit 100 may receive a discharge from Capacitor 120A via Discharge Switch 130A, at the same time receive a discharge from Capacitor 120B via Discharge Switch 130B, and combine these discharges. The output may be treated as a current or a voltage. For example, in some embodiments, Output Circuit 110 includes a current follower configured to mirror a current received as part of the combined discharge. In some embodiments, Output Circuit 110 includes an impedance (e.g., resistor) configured to cause a voltage differential when the combined discharge is passed through the impedance. In various embodiments, Output Circuit 110 includes an antenna, a balun, a wired communication channel, and or the like. In various embodiments, Output Circuit 110 is configured to couple the output into a high frequency communication system such as coax cable, a wireless device, or the like Output Circuit 110 is typically configured to appear as a low impedance currant sink from the point of view of Capacitors 120. Various alternative embodiments of Output Circuit 110 are discussed elsewhere herein.

The Digital-to-Analog Circuit 100 is typically configured to operate as follows. During the recharge period Control Circuit 135 closes Recharge Switches 125. The closure of Recharge Switches 125 allows current from Voltage Source 140 to recharge Capacitors 120. Capacitors 120 are optionally fully charged during the recharge period. At the end of the recharge period Recharge Switches are opened to isolate Capacitors 120 from Voltage Source 140. In the conversion period, which follows the recharge period, some or all of Discharge Switches 130 are closed by Control Circuit 135 and Digital Input Circuit 105. Control Circuit 135 is configured to control the timing of this switch closing while Digital Input Circuit 105 is configured to control which of Discharge Switches 130 are closed and which are left open. By closing some of all of Discharge Switches 130 charge is allowed to flow from Capacitors 120 to Output Circuit 110. This charge represents the analog output of Digital-to-Analog Circuit 100 and may be used as a voltage or current within Output Circuit 110. Further details of this operation are discussed elsewhere herein.

While the embodiments illustrated in FIG. 1 include four Unit Cells 115, alternative embodiments may include 2, 3 or more Unit Cells 115. For example, some embodiments in a thermometer configuration include n unit cells where n is the number of bits of digital data received by Digital Input Circuit 150 to be converted to an analog signal. Some embodiments, in a binary configuration, include $2^n-1$ unit cells where n is the number of bits of digital data received by Digital Input Circuit 150 to be converted to an analog signal. As is further described herein, the Unit Cells 115 included in Digital-to-Analog Circuit 100 may include a variety of types and or configurations.

Figure 2A:
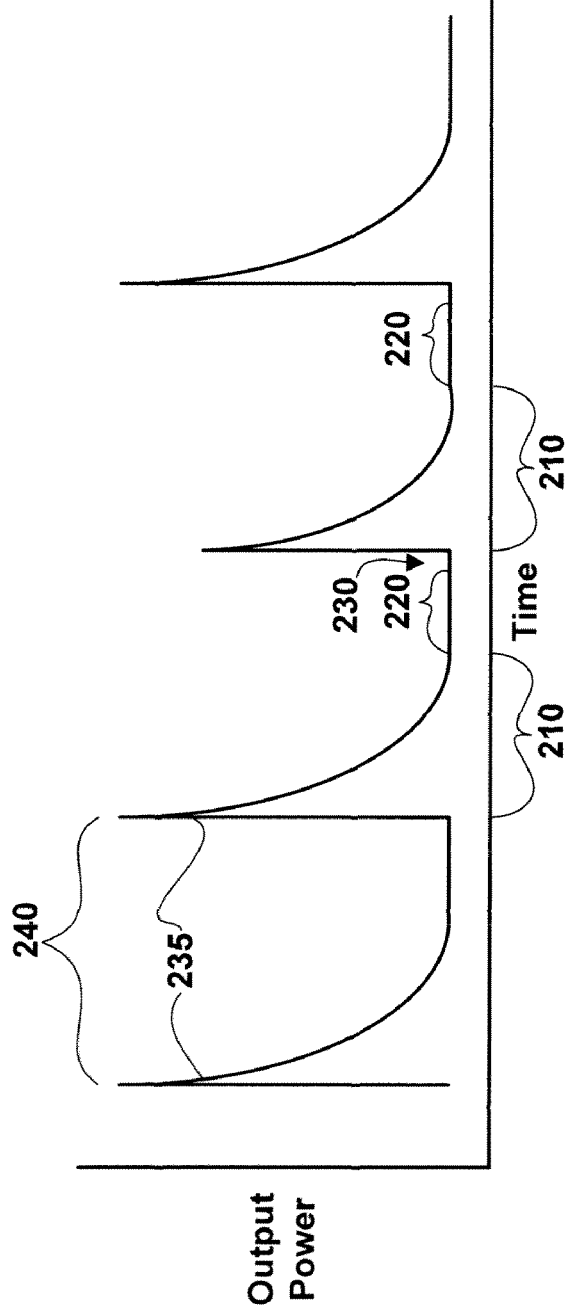
FIGS. 2A and 2B illustrate waveforms, according to various embodiments of the invention.
Figure 2B:
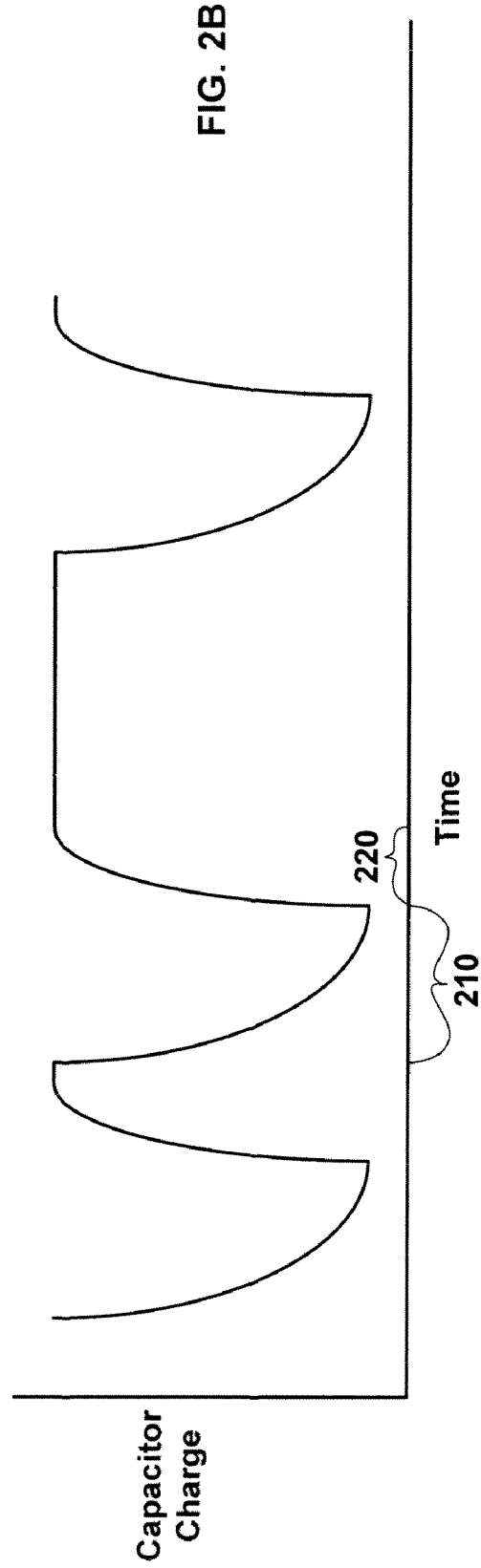

FIGS. 2A and 2B illustrate waveforms over several recharge and conversion periods, according to various embodiments of the invention. In FIG. 2A the total output power, as may be found at output Circuit 110, is illustrated as a function of time. In FIG. 2B the charge on one of Capacitors 120 is illustrated over the same time scale. During a Conversion Period 210 Capacitors 120 are discharged through Discharge Switches 130 to provide power at Output Circuit 110. The length of this discharge is a function of the RC time constant of Capacitors 120, the impedance of Discharge Switches 130 and the impedance into Output Circuit 110. The total power of the discharge is dependent on which members of Capacitors 120 are discharged, which is dependent on the digital input value received at Digital Input Circuit 105. For example, in FIG. 2A one of the output pulses is of lower magnitude than the other three. This difference in magnitude reflects a change in the members of Capacitors 120 that are discharged in each Conversion Period 210. This change is illustrated by FIG. 2B in which one of Capacitors 120 is not discharged during the third Conversion Period 210. Recharge Switches 125 are in an open state during Conversion Period 210.

Recharge Period 220 is followed by a Recharge Period 220. During Recharge Period 220 Capacitors 120 are recharged through Recharge Switches 125, and all of Discharge Switches 130 are in an open state. The length of Recharge Period 220 is dependent on the RC time constant of Capacitors 120 and the output impedance of Voltage Source 140. Recharge Period 220 may be longer than or shorter than Conversion Period 210. An optional Gap 230, during which neither recharging nor discharging occurs, may occur before or after Recharge Period 220.

Through repeated recharge and conversion periods, the output comprises a series Pulses 235 whose area and height are representative of the digital input. The Period 240 between the Pulses 235 is dependent on the frequency at which the recharge and conversion periods occur and the minimum Period 240 is dependent on the length of the recharge and conversion periods. The frequency of the output, e.g., the sampling frequency, is one over the Period 240. In some embodiments, the output is viewed as a mixing of the digital input signal with the sampling frequency. This mixing may be used to move the digital input signal up to a higher frequency domain. Because this mixing is a result of the digital-to-analog conversion process, an additional mixer is not required to move the signal to higher frequencies. The output of Digital-to-Analog Circuit 100 is in the form of a pulse of charge resulting from the discharge of capacitors. The charge is representative of the digital input. Although this charge may be converted to a voltage or a current, providing an output in the form of a delivery of charge is in contrast with digital-to-analog systems of the prior art, which typically provide a current or voltage that is representative of a digital input.

Figure 3A:
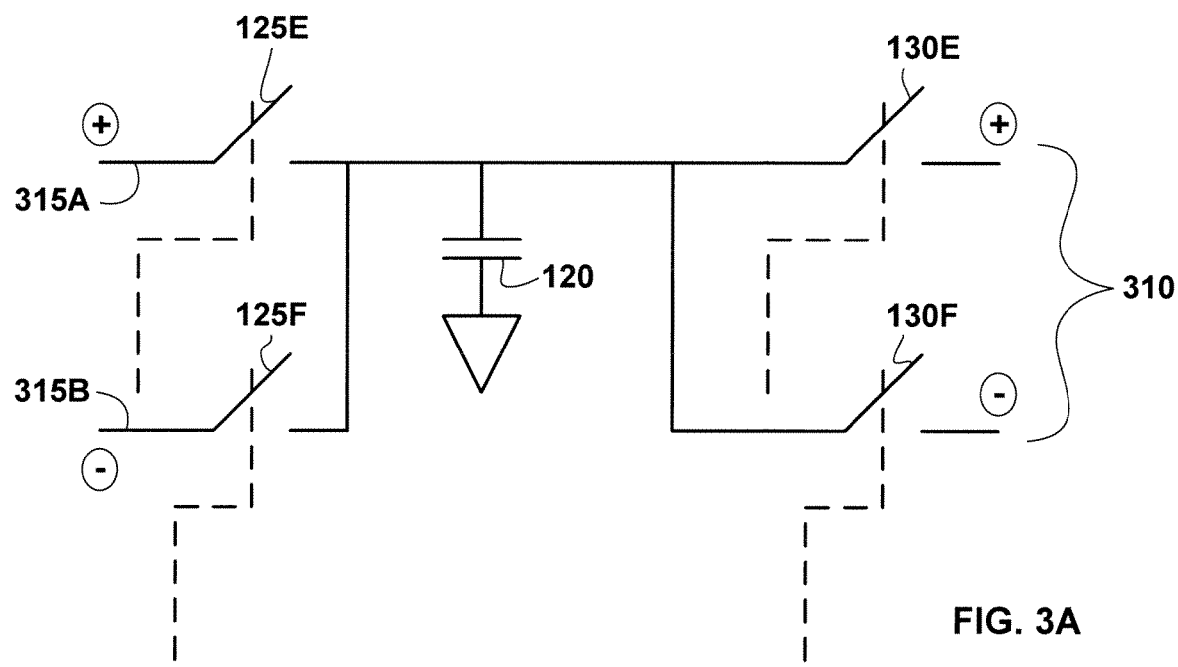
FIGS. 3A-3C illustrate digital-to-analog circuit elements including a differential output, according to various embodiments of the invention.
Figure 3B:
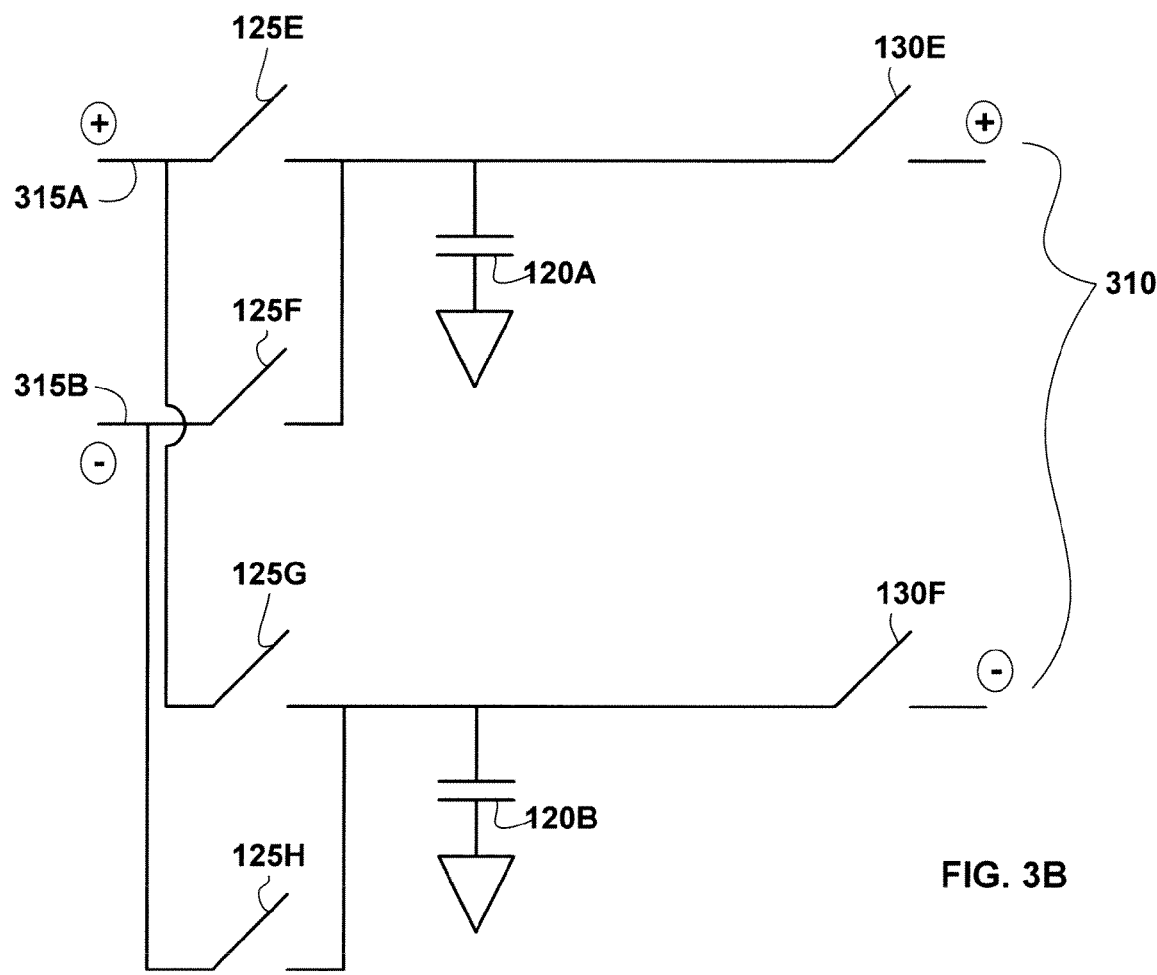
Figure 3C:
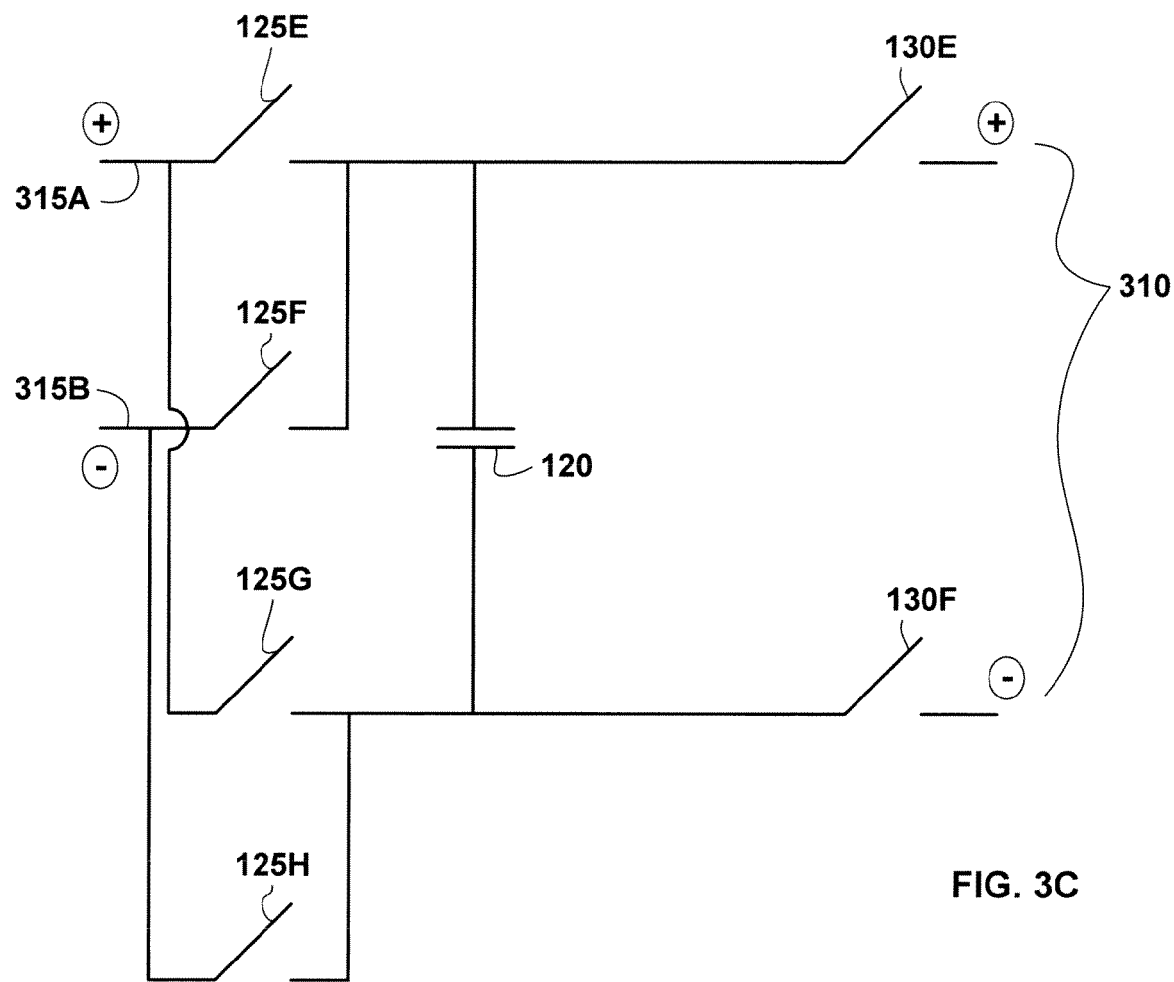

FIGS. 3A-3C illustrate digital-to-analog circuit elements including a Differential Output 310, according to various embodiments of the invention. The circuit elements illustrated represent embodiments of Unit Cell 115. These embodiments of Unit Cell 115 may be included within Digital-to-Analog Circuit 100, optionally in combination with different embodiments of Unit Cell 115. The Differential Output 310 is optionally electrically coupled to a differential embodiment of Output Circuit 110. In FIG. 3A-3C "+" and "−" symbols are used to indicate different voltages, which may or may not be of different sign. A differential output is an output in the form of a relative difference between two points. This difference can be voltage, current, charge, power, etc, and is typically a function of an input. A differential output is sometimes preferable in that it can reduce certain types of noise. As used herein, a circuit is considered differential if it has a differential output or a single ended output that is generated from an intermediate differential circuit. For example, in some embodiments, Differential Output 310 includes an active or passive Balun configured to receive a differential signal from one or more Unit Cells 115 and to produce a single ended output. In these embodiments, Digital-to-Analog Circuit 100 is still considered differential because of the intermediate differential signals received from the one or more Unit Cells 115.

The circuit of FIG. 3A includes Charging Input 315A and optionally Charging Input 315B configured to receive charging currents of different magnitude and/or different sign. For example, in one embodiment the Charging Input 315A is coupled to an output of Voltage Source 140 configured to charge Capacitors 120 to +5V, while the Charging Input 315B is coupled to an output of Voltage Source 140 configured to charge Capacitors 120 to −5V. In another embodiment Charging Input 315B is coupled to an output of Voltage Source 140 configured to charge Capacitors 120 to +0.5V. In typical operation the two different Charging Inputs 315A and 315B are used in alternating charging periods. In a first Recharge Period 220 Recharge Switch 125E is closed, while optional Recharge Switch 125F is opened, thus charging Capacitor 120 to a first voltage. In the next Recharge Period 220 Recharge Switch 125F is closed, while Recharge Switch 125E is open, thus charging Capacitor 120 to a second voltage. The result of this operation is a differential power output at Output Circuit 110 in which different analog outputs appear in alternative cycles. Discharge Switches 130E and optionally 130F are configured to control to which side of Differential Output 310 a particular discharge is delivered. In some embodiments, when Recharge Switch 125F is used to charge Capacitor 120 Discharge Switch 130F is used to discharge, and when Recharge Switch 125E is used to charge Capacitor 120 Discharge Switch 130E is used to discharge. The different analog outputs are optionally treated as a single differential output. In other modes of operation Recharge Switch 125F is optional and one of Discharge Switches 130E and 130F are closed responsive to a digital input.

The circuit of FIG. 3B provides a differential output whose polarity can be controlled by selective setting of Recharge Switches 125E-125H. Capacitor 120A can be charged from Charging Input 315A by closing Recharge Switch 125E, or alternatively charged from Charging Input 315B by closing Recharge Switch 125F. If Charging Inputs 315A and 315B are coupled to different voltage level outputs of Voltage Source 140, then the voltage to which Capacitor 120 A is charged can be controlled by selecting which of Recharge Switches 125E or 125F to close. Likewise, Capacitor 120B can be charged from Charging Input 315A by closing Recharge Switch 125G, or alternatively charged from Charging Input 315B by closing Recharge Switch 125H In typical operation Charging Switches 125E and 125H are closed together, and Charging Switches 125F and 126G are closed together. The polarity of Differential Output 310 is determined by which pair of charging switches are closed together, which in turn is determined by a digital input bit. The circuit of FIG. 3B may be treated as one or two Unit Cell 115. In alternative embodiments a single Unit Cell 115 is coupled to more than two charging voltages and includes Charging Inputs 315 and Recharge Switches 125 configured to selectively charge a capacitor to more than two alternative voltages. Both Discharge Switches 130E and 130F are typically both closed during discharge.

The circuit of FIG. 3C is functionally similar to that of FIG. 3B. However, a single Capacitor 120 is allowed to float between the voltage applied to Charging Input 315A and Charging Input 315B. The charge on each side of Capacitor 120 is provided to Differential Output 315 when Discharge Switches 130E and 130F are closed together during Conversion Period 210. The circuit of FIG. 3C represents one Unit Cell 115.

Figure 4:
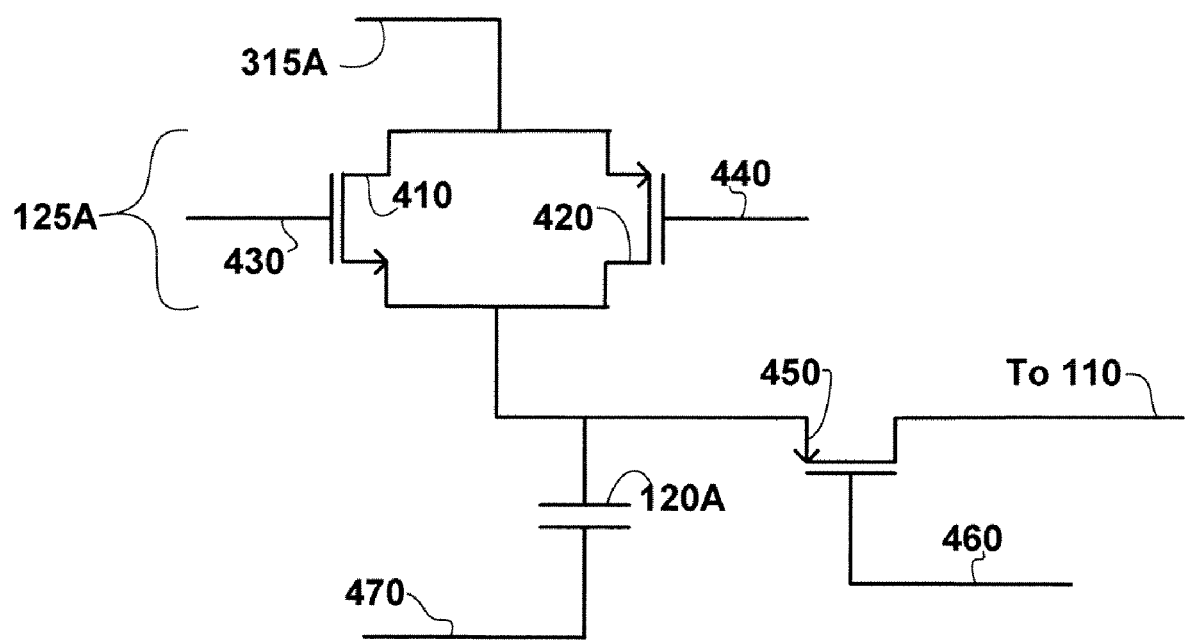
FIG. 4 illustrates an alternative digital-to-analog circuit element, according to various embodiments of the invention.

FIG. 4 illustrates alternative embodiments of Unit Cell 115, according to various embodiments of the invention. These embodiments include charging a capacitor and then using a transistor to control providing the charge as an output. A voltage from Charging Input 315A is passed through Charging Switch 125A to Charge Capacitor 120A. In FIG. 4 a solid state example of Charging Switch 125A is illustrated. This example of Charging Switch 125A includes a pair of Transistors 410 and 420. The bases of Transistors 410 and 420 receive voltages at Inputs 430 and 440, respectively. In typical operation Input 430 will receive a voltage representative of a logical 1 or 0, while Input 440 will receive a voltage representative of the logical NOT of the input represented at Input 430. For example, when Input 430 receives a voltage representing a logical 1 Input 440 will receive a voltage representative of a logical 0. The voltages at Inputs 430 and 440 will control whether current can flow from Charging Input 315A to charge Capacitor 120.

A Transistor 450 is used in place of Discharge Switch 130A. Transistor 450 will prevent discharge of Capacitor 120A as long as the voltage at the source of Transistor 450 (to which Capacitor 120A is connected) is less than or equal to a voltage at a Gate Input 460 of Transistor 450. In typically operation the voltage at Gate Input 460 is the same as that at Charging Input 315A. Thus, the charging of Capacitor 120A from Charging Input 315A through Switch 125A is not sufficient to turn on Transistor 450.

One side of Capacitor 120A is coupled to a Discharge Trigger Input 470. Application of a trigger voltage to this side of Capacitor 120A can be used to increase the voltage on the side of Capacitor 120A to which Transistor 450 is coupled. Specifically, application of an appropriate trigger voltage to Discharge Trigger Input 470 can be used to raise the voltage at the source of Transistor 450 to a voltage that is greater than the voltage at Gate Input 460 (plus a junction potential). This turns on, e.g., reduces the source-drain impedance of Transistor 450 and allows the discharge of Capacitor 120A through Transistor 450 to Output Circuit 110. The approach to Unit Cell 115 illustrated in FIG. 4 can be referred to as the "charge and spill" approach.

Alternative embodiments of Unit Cell 115 will be apparent to one of ordinary skill in the art. Different types of Unit Cell 115 may be used in the same Digital-to-Analog Circuit. As is discussed further herein, Unit Cells 115 may be separated into different banks or modules.

Figure 5:
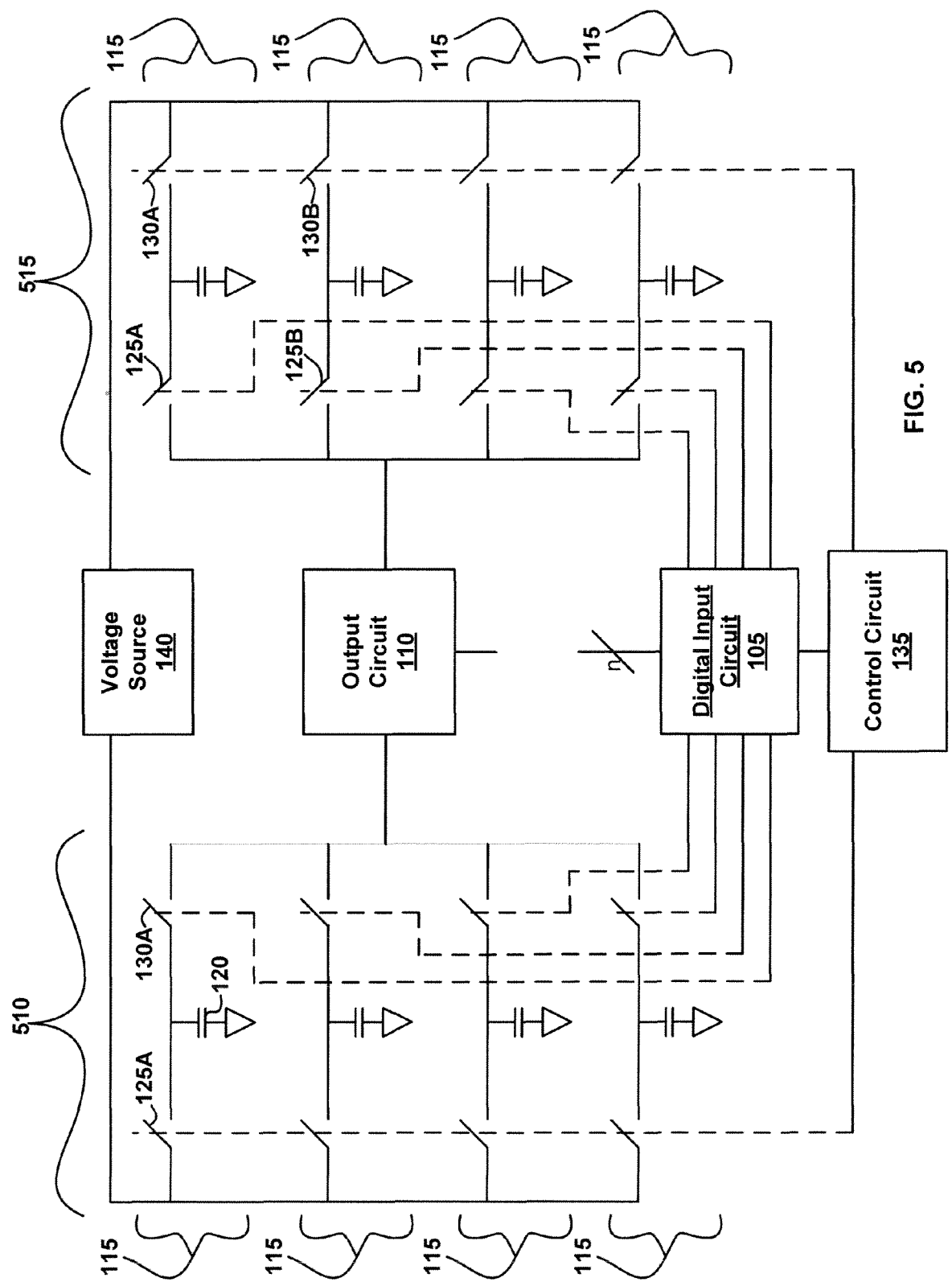
FIG. 5 illustrates a digital-to-analog circuit including more than one multiple capacitor bank, according to various embodiments of the invention.

FIG. 5 illustrates a digital-to-analog circuit including more than one bank of Unit Cells 115, according to various embodiments of the invention. A First Bank 510 and a Second Bank 515 are illustrated, however alternative embodiments include more than two banks. The outputs of First Bank 510 and Second Bank 515 are combined at Output Circuit 110 to produce a single output signal. First Bank 510 and Second Bank 515 may be operated in parallel or serially. In parallel operation the Conversion Period 210 of each bank occurs at essentially the same time. The use of more than one bank allows for a greater amount of output power and/or the conversion of a greater number of decimal bits. In serial operation the Conversion Period 210 of First Bank 510 occurs at a different time than the Conversion Period 210 of Second Bank 515. In repetitive cycles digital-to-analog conversion may alternate between First Bank 510 and Second Bank 515. This allows conversion to occur in a shorter period than the sum of a single Conversion Period 210 and Recharge Period 220, and allows the output of Output Circuit 110 to be at a greater frequency than would be possible using First Bank 510 or Second Bank 515 alone.

In some embodiments Control Circuit 135 is controllable to operate First Bank 510 and Second Bank 515 in either a parallel or serial mode. In the parallel mode each of Recharge Switches 125, in both First Bank 510 and Second Bank 515 are opened and closed at approximately the same time. Likewise, selected members of Discharge Switches 130 in both banks are opened and closed at approximately the same time. If more output power is desired Control Circuit 135 may use Digital Input Circuit 105 select the same set of Discharge Switches 130A in each bank. Alternatively, if a larger dynamic range is desired. Digital Input Circuit 105 may be used to select different sets of Discharge Switches 130 in each bank.

In the serial mode, Control Circuit 135 is configured to alternatively perform Conversion Periods 210 on First Bank 510 and Second Bank 515. For example, Recharge Switches 125 and Discharge Switches 130 may be set for a Conversion Period in First Bank 510 while the corresponding switches in Second Bank 515 are set for a Recharge Period 220, and vice-versa. The serial use of two banks allows for a doubling of the conversion frequency.

Figure 6A:
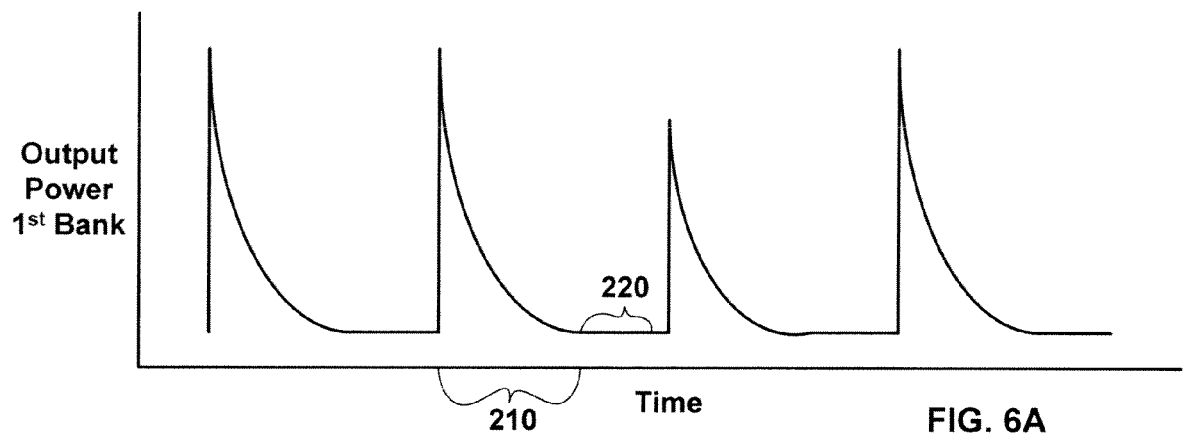
FIGS. 6A-6C illustrate output waveforms generated using two capacitor banks, according to various embodiments of the invention.
Figure 6B:
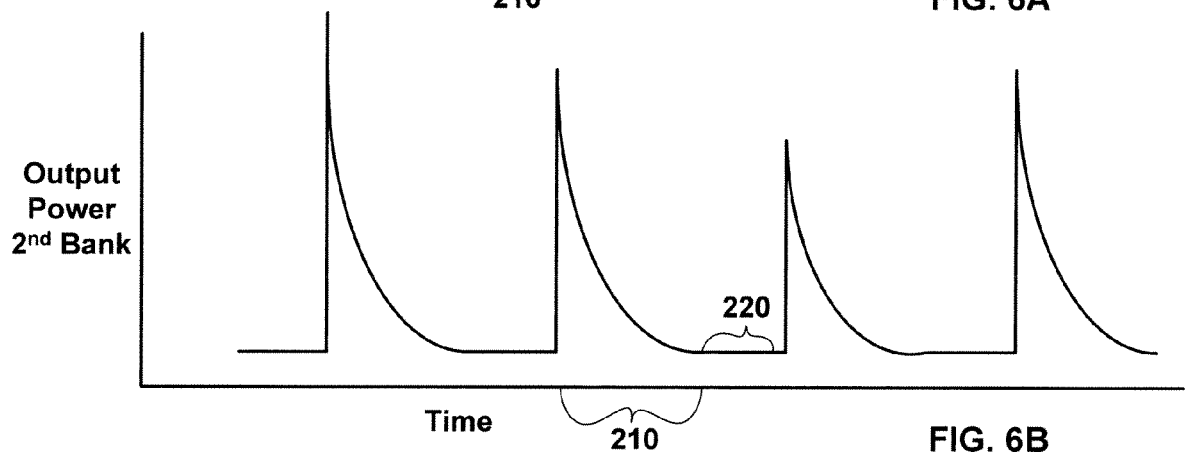
Figure 6C:
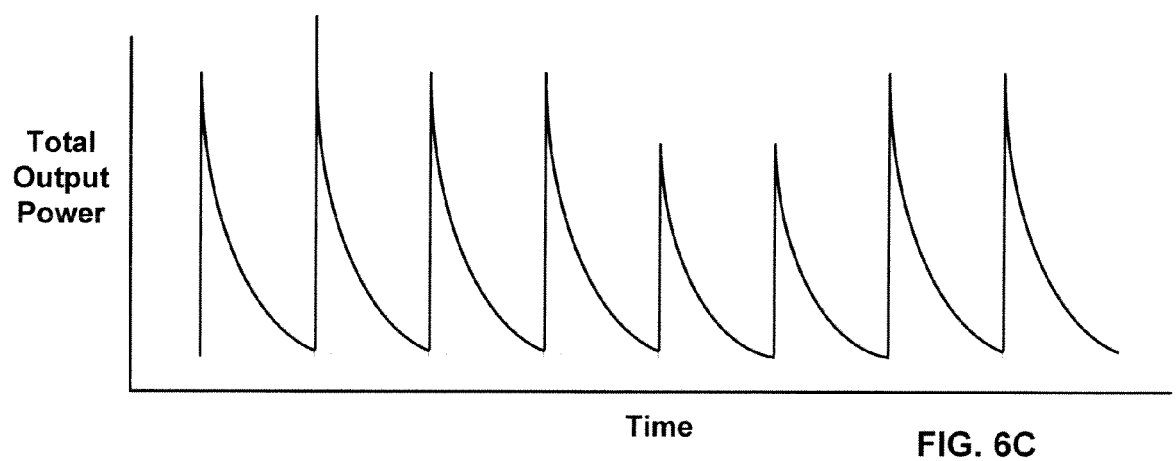

FIGS. 6A-6C illustrate output waveforms generated using First Bank 510 and Second Bank 515 used in a serial operation, according to various embodiments of the invention. The output of each of First Bank 510 and Second Bank 515 comprises a series of pulses as further discussed elsewhere herein, e.g., with regard to FIGS. 2A and 2B. FIGS. 6A and 6B illustrate an example of how the Conversion Period 210 and Recharge Period 220 of First Bank 510 may be offset in time relative to the Conversion Period 210 and Recharge Period 220 of Second Bank 515. The Conversion Period 210 of First Bank 510 may overlap with the Recharge Period 220 of Second Bank 515. Likewise, the Conversion Period 210 of Second Bank 515 may overlap with the Recharge Period 220 of First Bank 510. FIG. 6C illustrates the sum of the output of First Bank 510 and Second Bank 515 as would be found at Output Circuit 110. The frequency of this summed output is greater than that produced by either of the individual banks. In alternative embodiments, three, four or more banks are used to achieve an even greater frequency.

Unit Cells 115 may be arranged in a binary bank or a thermometer bank. A thermometer bank is a bank in which each Unit Cell 115 provides the same output power when activated. For example, a thermometer bank including four Unit Cells 115 (each able to provide one unit of output) can represent five different output levels 0, 1, 2, 3, and 4. Two of Unit Cells 115 are activated to produce an output level of 2 and all for Unit Cells 115 are activated to produce an output level of 4. Three unit cells in a thermometer bank are sufficient to convert two bits of binary data to an analog signal. In various embodiments, a thermometer bank may include 2, 3, 4, 5, 6, 7, 8 or more Unit Cells 115.

A binary bank is a bank in which different Unit Cells 115 are configured to provide different output power when activated. For example, in a typical binary bank a first Unit Cell 115 may is configured to provide one unit of output power, a second Unit Cell 115 is configured to provide two units of output power and a third Unit Cell 115 is configured to provide four units of output power. If the first and third Unit Cells 115 are activated then a total of five units of output power are provided. Likewise, if all three Unit Cells 115 are activated then a total of 7 units of output power are provided. Each Unit Cell 115 in a binary bank is sufficient to convert one bit of digital data. For example, a binary bank including four Unit Cells 115 can convert four binary bits to an analog signal. In various embodiments, a binary bank may include 2, 3, 4, 5, 6, 7, 8 or more Unit Cells 115.

Figure 7:
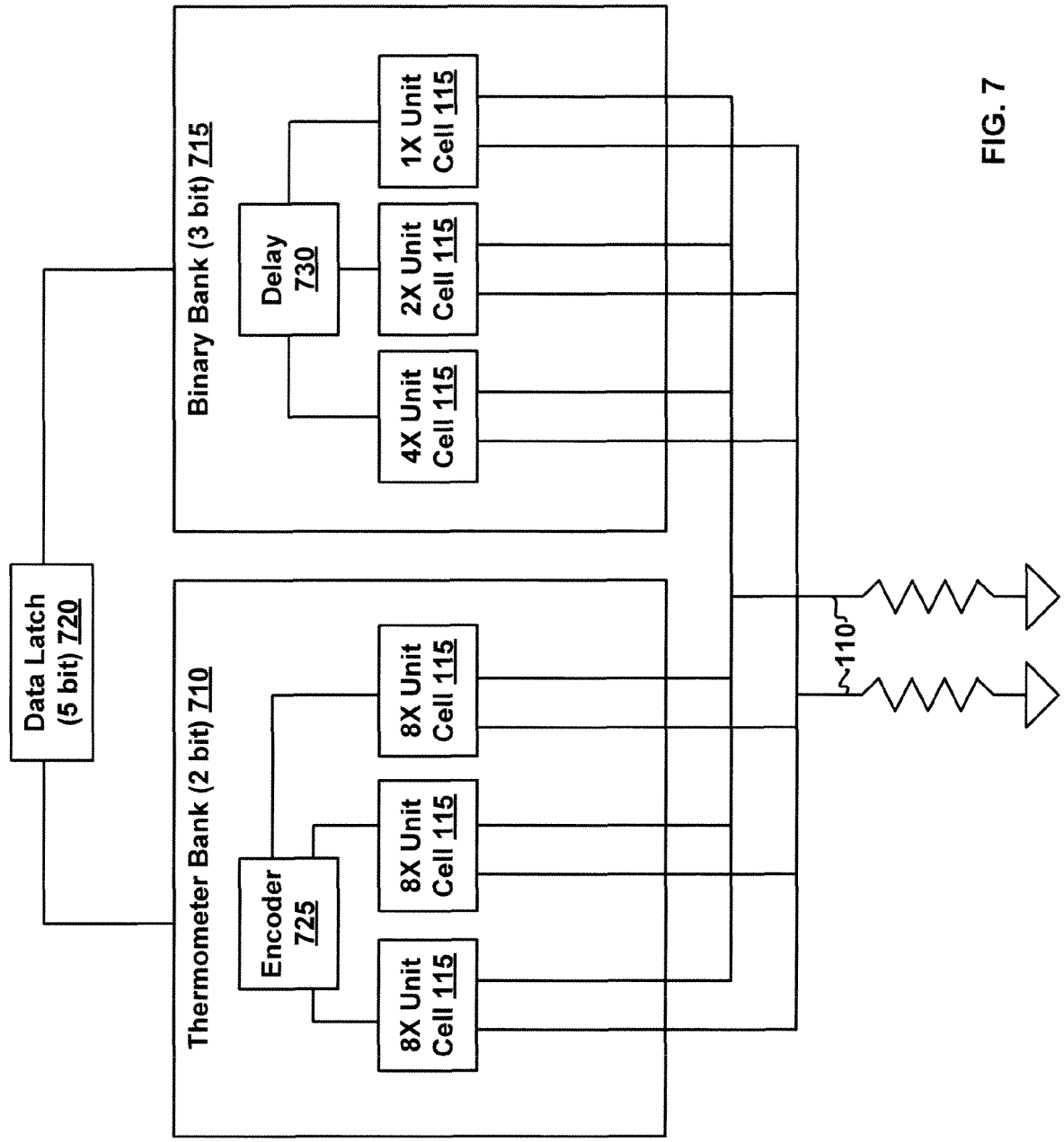
FIG. 7 illustrates a digital-to-analog circuit including both thermometer and a binary bank, according to various embodiments of the invention.

FIG. 7 illustrates various embodiments of Digital-to-Analog Circuit 100 wherein First Bank 510 comprises a Thermometer Bank 710 and Second Bank 515 comprises a Binary Bank 715. In these embodiments of Digital-to-Analog Circuit 100, Digital Input Circuit 105 includes a Data Latch 720, an Encoder 725, and a Delay 730. Data Latch 720, Encoder 725 and Delay 730 may be considered components of Digital Input Circuit 105. In these embodiments Data Latch 720 is configured to receive five bits of digital binary data to be converted to an analog signal. Data Latch 720 provides two of these bits to Thermometer Bank 710 and three of these bits to Binary Bank 715. In alternative embodiments of the invention Data Latch 720 is configured to receive a different number of bits and/or divide the bits differently between two or more banks.

The Unit Cells 115 within Binary Bank 715 are configured to provide one unit (1x), two units (2x) or four units (4x) of output power. In contrast, the Unit Cells 115 within Thermometer Bank 710 are each configured to provide eight units (8x) of output power. When used in parallel, in the illustrated embodiments. Binary Bank 715 is configured to convert the least significant bits of the digital data and Thermometer Bank 710 is configured to convert the most significant bits. Output Circuit 110 includes two resistors to ground and is configured to receive the combined outputs of Binary Bank 715 and Thermometer Bank 710. The resistors are configured to convert the combined outputs to a voltage. The Unit Cells 115 within Binary Bank 715 may be configured to provide different amounts of power output through the use of different charging voltages, the use of different capacitor values, and/or the like.

Data Latch 720 is configured to store the received digital data and store it until digital data can be converted to the analog signal according to the timing of Control Circuit 135.

Encoder 725 is configured to encode bits received from Data Latch 720 for use by the Unit Cells 115 within Thermometer Bank 710. For example, if the received bits represent a binary value of two then the output of Encoder 725 is encoded to turn on two of the Discharge Switches 130. Likewise, if the received bits represent a binary value of four then the output of Encoder 725 is encoded to turn on four of the Discharge Switches 130 in Thermometer Bank 710.

Delay 730 is configured to delay digital signals received from Data Latch 720 to compensate for any delay that occurs in Encoder 725. Delay 730 is configured to delay the signals such that the data is received by the Unit Cells 155, within Binary Bank 715 and Thermometer Bank 710, at approximately the same time.

FIG. 8 illustrates a Transmitter System 800 including Digital-to-Analog Circuit 100, according to various embodiments of the invention. Digital-to-Analog Circuit 100 replaces a digital-to-analog converter, a filter and mixer typically found in transmitter systems of the prior art. Transmitter System 800 includes a Data Latch 810 configured to receive and hold digital data. Data Latch 810 is optionally configured to received both "I" and "Q" data from a digital signal processor. Data Latch 810 optionally includes parts of Digital Input Circuit 105. Digital input data is communicated from Data Latch 810 to Digital-to-Analog Circuit 100 for conversion to an analog output circuit as discussed elsewhere herein. The output of Digital-to-Analog Circuit 100 is an analog representation of the digital input data and is also mixed with the sampling frequency of Digital-to-Analog Circuit 100. Because the operation of Digital-to-Analog Circuit 100 achieves both digital-to-analog conversion and mixing at the same time, an additional mixer is not required.

The analog output of Digital-to-Analog Circuit 100 is provided to a band selection Filter 820. Filter 820 is a configured to remove a baseband signal and/or any unwanted RF sidebands. Filter 820 is typically disposed before an Amplifier 830, although in some embodiments may follow Amplifier 830. Amplifier 830 is configured to boost the signal to a required level for transmission. The output of Amplifier 830 is received by a Coupler 840. Coupler 840 is configured to provide the proper impedance for transmission and optionally provides duplexer functionality. Coupler 840 may include a transformer, antenna, current copier, a balun, or the like. Filter 820, Amplifier 830 and/or Coupler 840 are optionally part of Output Circuit 110.

Figure 9:
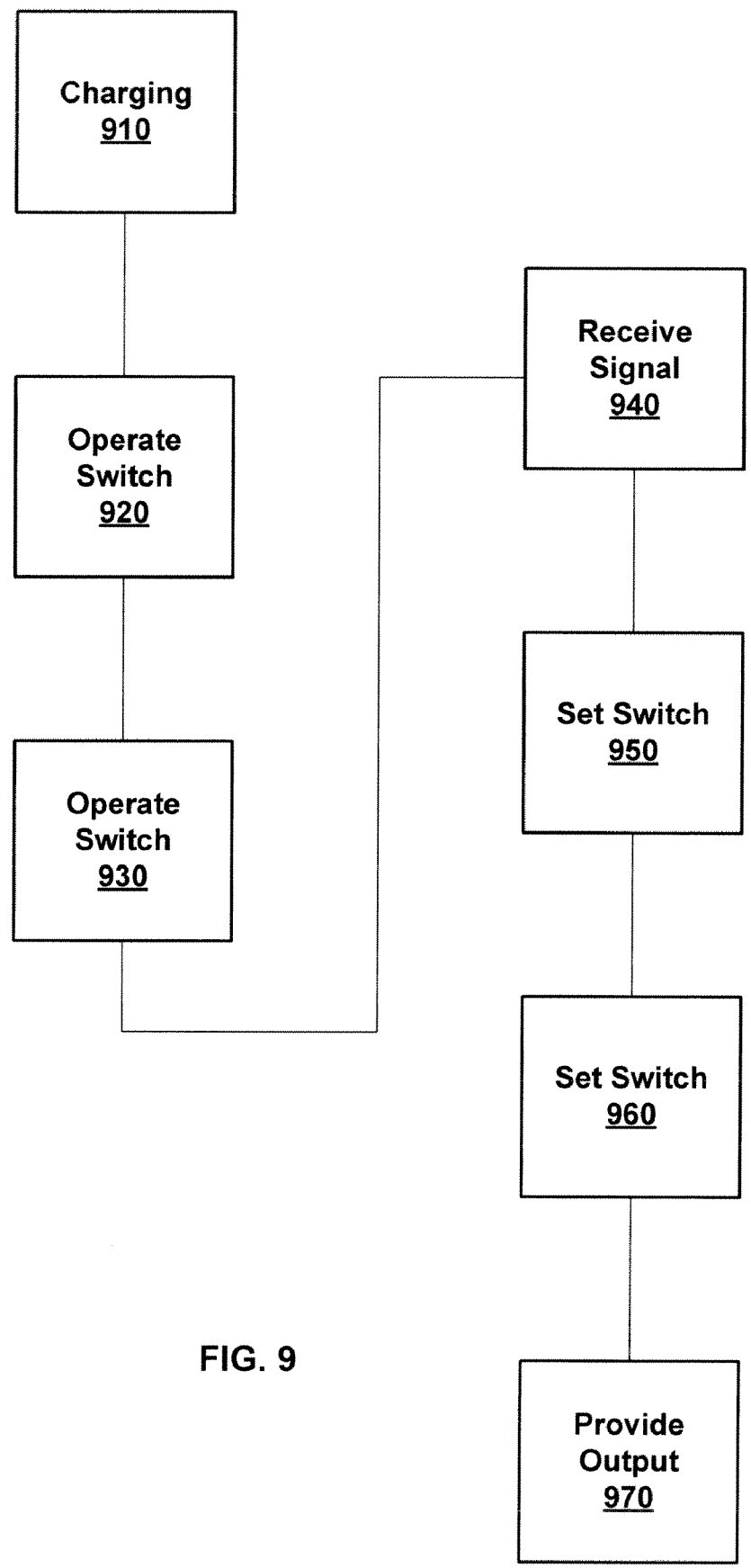
FIG. 9 illustrates a method of converting a digital input signal to an analog output signal, according to various embodiments of the invention.

FIG. 9 illustrates a method of converting a digital input signal to an analog output signal, according to various embodiments of the invention. This method may be performed using digital-to-Analog Circuit 100. The method includes charging a plurality of capacitors and then discharging selected members of the plurality of capacitors based on a digital input. The plurality of capacitors are optionally charged before the digital input is received. The discharge of the selected members constitute the analog output signal, which may be expressed as a current, power or voltage, etc.

More specifically the method illustrated in FIG. 9 includes a Charging Step 910 in which both a first capacitor and a second capacitor, e.g., Capacitors 120A and 120B, are charged using one or more voltage sources such as Voltage Source 140. These capacitors are typically charged at the essentially the same time in parallel operation. In serial operation these capacitors are charged at the same time when in the same bank and optionally at different times when in different banks. Charging Step 910 optionally includes charging three, four or more of Capacitors 120.

In an Operate Switch Step 920, a first of Recharge Switches 125 is opened such that the first capacitor is electrically disconnected from the voltage source. In an Operate Switch Step 930 a second of Recharge Switches 125 is opened such that the second capacitor is electrically disconnected from the voltage source. In parallel operation, Operate Switch Step 920 and Operate Switch Step 930 are performed at approximately the same time. In serial operation Operate Switch Step 920 and Operate Switch Step 930 are optionally performed at different times when the switches control charging of capacitors in different banks, and typically performed at approximately the same time when the switches control charging of capacitors in the same bank.

In a Receive Signal Step 940 a digital signal is received by Digital Input Circuit 105. This digital signal includes at least two bits and is the signal to be converted to an analog signal. Receive Signal Step 940 optionally includes dividing bits of the digital signal between First Bank 510 and Second Bank 515. Further, Receive Signal Step 940 optionally includes encoding the binary data using Encoder 725.

In a Set Switch Step 950 a first discharge switch, e.g., Discharge Switch 130A, is closed responsive to the value of the digital signal received by Digital Input Circuit 105 in Receive Signal Step 940. Closure of the first discharge switch allows the discharge of the corresponding capacitor. For example, closing Discharge Switch 130A results in the discharge of Capacitor 120A to Output Circuit 110.

In a Set Switch Step 960 a second discharge switch, e.g., Discharge Switch 130B, is closed responsive to the value of the digital signal received by Digital Input Circuit 105 in Receive Signal Step 940. Closure of the second discharge switch allows the discharge of the corresponding capacitor. For example, closing Discharge Switch 130B results in the discharge of Capacitor 120B to Output Circuit 110. In parallel operation, Set Switch Step 950 and Set Switch Step 960 are performed at approximately the same time. In serial operation Set Switch Step 950 and Set Switch Step 960 are optionally performed at different times when the switches control discharging of capacitors in different banks, and typically performed at approximately the same time when the switches control discharging of capacitors in the same bank. Discharging of the first capacitor can be performed independently of discharging of the second capacitor, depending on the value of the digital signal.

In a Provide Output Step 970 the discharge of the first and second capacitors are provided to Output Circuit 110 through the first and second discharge switches. The charge discharged from the first and second capacitors, and optionally further capacitors depending on the value of the digital signal, represents the output of the method at Output Circuit 110. The power, e.g., charge and current, of the output is responsive to the settings of the first discharge switch and the second discharge switch.

In alternative embodiments one, three, four or more capacitors are discharged responsive to the value of the digital signal. The frequency of the output at output Circuit 110 is optionally greater than a frequency at which digital input data is received by Digital Input Circuit.

Figure 10:
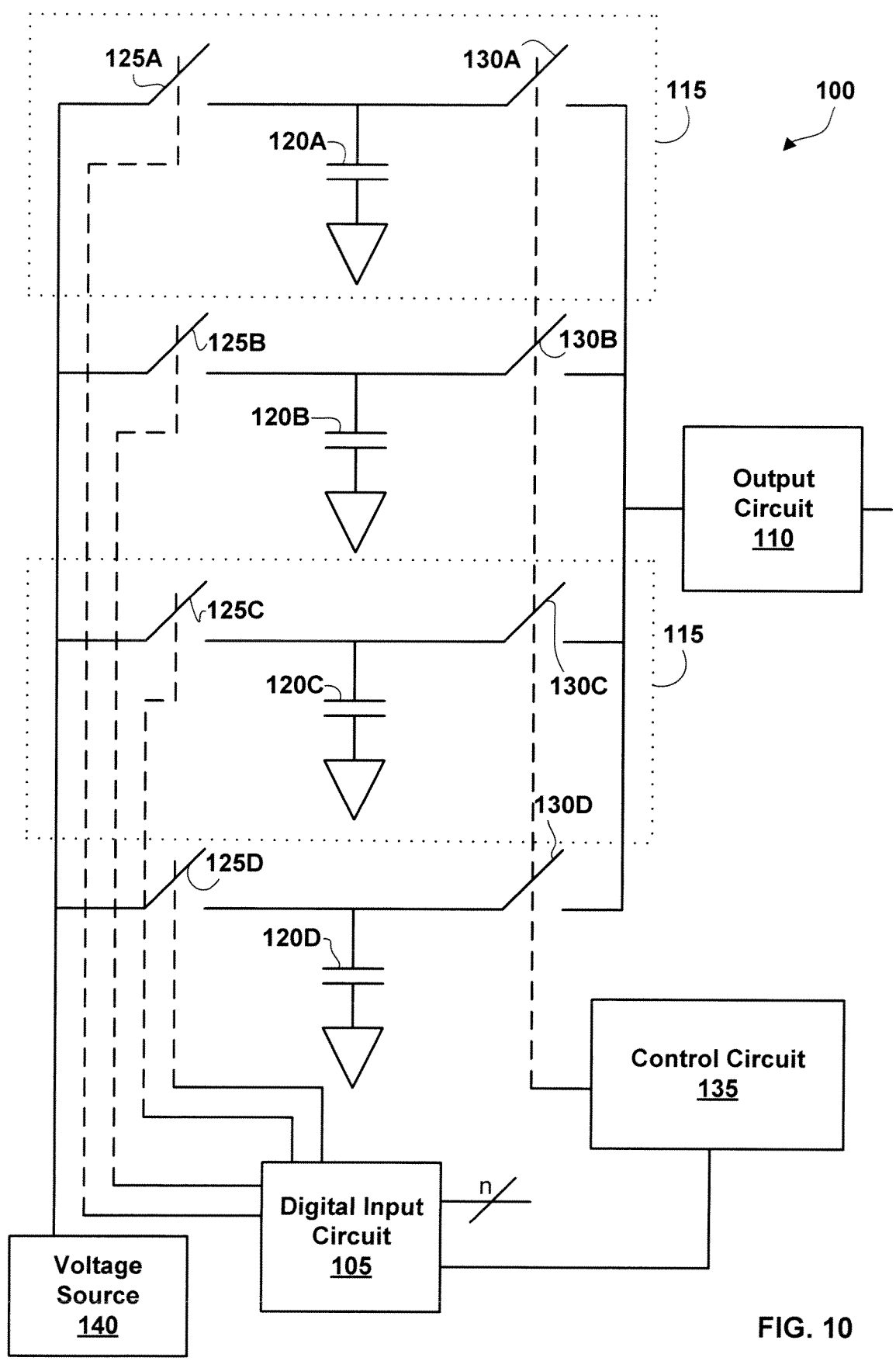
FIG. 10 illustrates a digital-to-analog circuit in which capacitors are charged based on a digital input, according to various embodiments of the invention.

FIG. 10 illustrates alternative embodiments of Digital-to-Analog Circuit 100 in which capacitors are charged based on a digital input. The embodiments illustrated in FIG. 10 differ from those illustrated by FIG. 1 in that the digital information is used to control charging rather than discharging of the Capacitors 120. Specifically, Digital Input Circuit 105 is coupled to Recharging Capacitors 125 and controls which members of Capacitors 120 are charged during Recharge Period 220. Only a subset of Capacitors 120 may be charged during Recharge Period 220 depending on the digital input value received by Digital Input Circuit 105. During Conversion Period 210 all of Discharge Switches 130 are typically closed to allow charge from those members of Capacitors 120 that were charged during Recharge Period 220 to discharge into Output Circuit 110. The analog output of Digital-to-Analog Circuit 100 consists of the charge discharged from Capacitors 120 during Conversion Period 210. In alternative embodiments, Digital Input Circuit 105 is configured to selectively close a subset of Recharge Switches 125 during Recharge Period 220 and also to selectively close a subset of Discharge Switches 130 during Conversion Period 210.

Figure 11B:
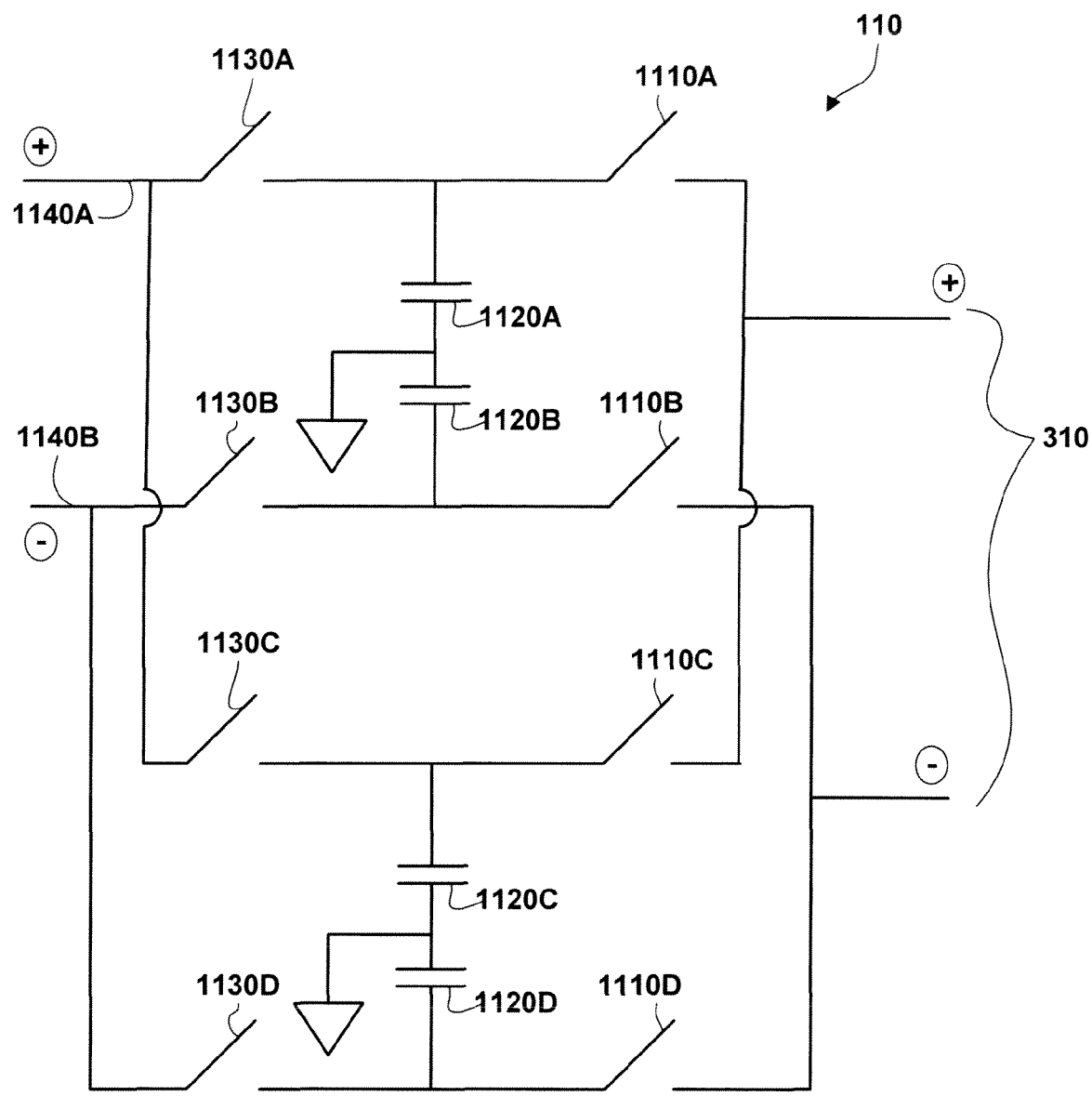

FIG. 11A-11C illustrate alternative embodiments of Output Circuits 110, according to various embodiments of the invention. These embodiments allow charge discharged from Capacitors 120 to be temporally stored in one or more Storage Capacitor 1120 prior to being provided as an analog charge output of Digital-to-Analog Converter 100. The use of Storage Capacitor 1120 is optionally used to make the RC time constant of the output independent of the digital value being converted. For example, in the embodiments of Digital-to-Analog Circuit 100 illustrated by FIG. 1 the capacitance and, thus, the RC time constant of the output will be dependent on the sum of the capacitance of the capacitors providing the charge. The number and identities of these capacitors will vary depending on the value of the digital input. By transferring the charge to one or more Storage Capacitor 1120 and then providing the analog output the capacitance of the output is that of the one or more Storage Capacitor 1120. This capacitance, and the resulting RC time constant, is independent of the digital value being converted. The charge may then be delivered to additional circuits such as Filter 820, Amplifier 830, Coupler 840, any combination thereof, or the like. In some embodiments, each of Capacitor 120 are charged to the same voltage and then selectively discharged to Storage Capacitor 1120. Alternatively, each of Capacitor 120 is charged to one of two alternative levels as a function of a digital input and then discharged to Storage Capacitor 1120. Alternatively, each of Capacitor 120 is charged to three or more alternative voltages as a function of a digital input and then discharged to Storage Capacitor 1120. The digital input is optionally used to select states of both Recharge Switches 125 and Discharge Switches 130. The use of both sets of switches is optionally used to perform logic operations.

FIG. 11A illustrates embodiments of Output Circuit 110 including an Output Switch 1110 and a Storage Capacitor 1120. Storage Capacitor 1120 is configured to receive the output charge from Capacitors 120 via Discharge Switches 130 while Output Switch 1110 is open. After the output charge is received by Storage Capacitor 1120, Discharge Switches 130 are opened and Output Switch 1110 is closed. The output charge is then delivered from Storage Capacitor 1120. This provides the analog charge output a consistent RC time constant dependant on the capacitance of Storage Capacitor 1120 and the impedance of Output Switch 1110.

FIG. 11B illustrates differential embodiments of Output Circuit 110 including several Storage Capacitor 1120, individually labeled 1120A-1120D. Each of Storage Capacitor 1120 typically have the same capacitance. The embodiments illustrated in FIG. 11B are configured to receive charge from a differential embodiment of Digital-to-Analog Circuit 100, e.g., embodiments including the differential Unit Cells 115 illustrated in FIGS. 3A-3D. The differential charge signal is received in alternative phases at Inputs 1140A and 1140B. In a first phase Output Switches 1130C and 1130D are closed while Output Switches 1130A and 1130B are open, and the differential charge output is provided to Storage Capacitors 1120C and 1120D. In a second phase Output Switches 1130A and 1130B are closed while Output Switches 1130C and 1130D are open, and the differential charge output is provided to Storage Capacitors 1120A and 1120B. In the first phase part of the differential analog charge output is provided at Differential Output 310 from Storage Capacitors 1120A and 1120B by closing Output Switches 1110A and 1110B. Likewise, in the second phase the other part of the differential analog charge output is provided at Differential Output 310 by closing Output Switches 1110C and 1110D. In typically operation, Storage Capacitors 1120A and 1120B receive charge from Unit Cells 115 while Storage Capacitors 1120C and 1120D are providing stored charge as an output, and vice versa.

FIG. 11C illustrates embodiments of Output Circuit 110 with an Output Switch 1110 but without a Storage Capacitor 1120. Storage Capacitor 1120 can be omitted in embodiments of Digital-to-Analog Circuit 100 in which the same Discharge Switches 130 are closed during Conversion Period 210 independent of the digital value being converted. For example, in those embodiments illustrated by FIG. 10. The functionality of Storage Capacitor 1120 can be achieved by redistributing charge among Capacitors 120C prior to providing the charge as an analog output. Specifically, if Discharge Switches 130 (FIG. 10) are closed while Output Switch 1110 is open charge will flow from those members of Capacitors 120 that were charged responsive to the digital input to the other members of Capacitors 120. The charge is then stored on the entire set of Capacitors 120 until Output Switch 1110 is closed. When Output Switch 1110 is closed the RC time constant of the analog charge output is dependent on the capacitance of the entire set of Capacitors 120 and the output impedance of the various switches.

The embodiments of Unit Cell 115 illustrated in FIGS. 3A-3D are optionally adapted for use as alternative embodiments of Output Circuit 110. For example, the Capacitors 120 and Discharge Switches 130 illustrated in FIGS. 3A and 3B may be used as Storage Capacitors 1120 and Output Switches 1110 in alternative embodiments of Output Circuit 110.

Figure 12A:
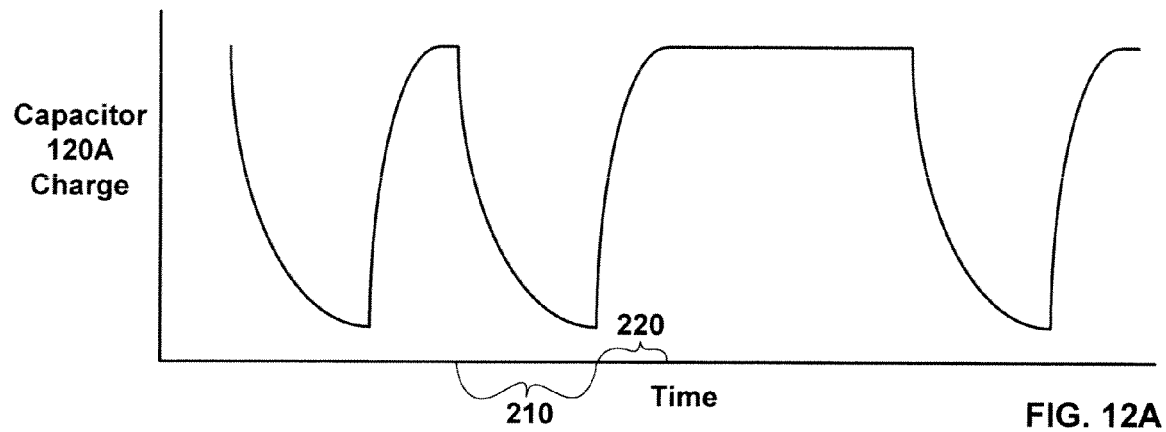
FIGS. 12A-12C include a timing diagram of a digital-to-analog circuit including a summing capacitor, according to various embodiments of the invention.
Figure 12B:
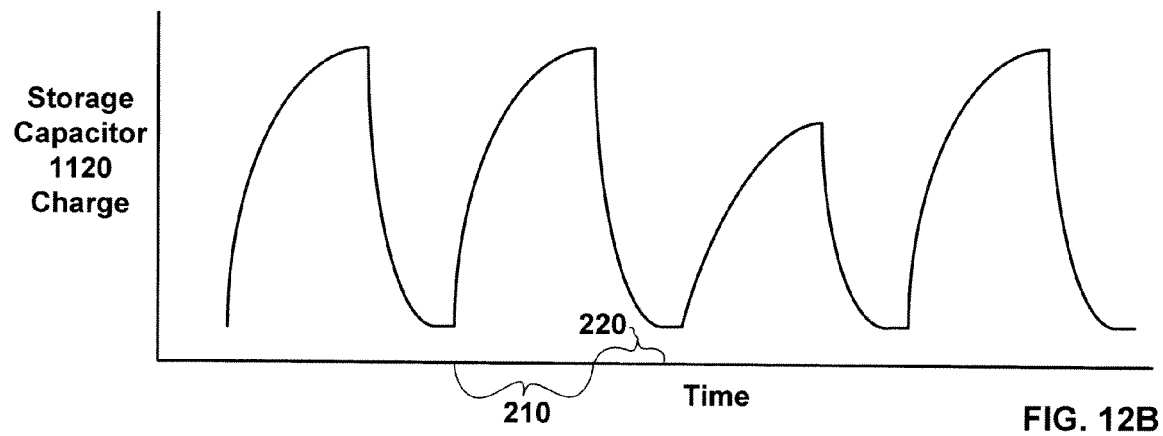
Figure 12C:
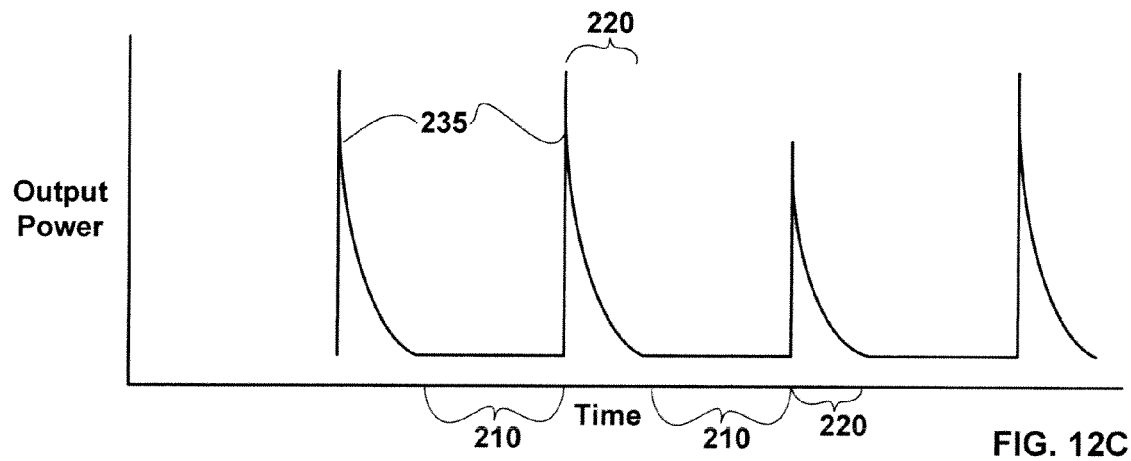

FIGS. 12A-12C include a timing diagram of a digital-to-analog circuit including a summing capacitor. FIG. 12A shows charge at one of Capacitors 120, e.g. Capacitor 120A. As discussed with respect to FIG. 2B, Capacitor 120A is charged during Recharge Period 220 and selectively discharged during Conversion Period 210. In embodiments, such as those illustrated by FIG. 1, the discharging of Capacitor 120A is dependent on the digital input value. In embodiments, such as those illustrated by FIG. 10, the charging of Capacitor 120A is dependent on the digital input value. FIG. 12B illustrates how the charge discharged from Capacitor 120A, and optionally other members of Capacitors 120, is received by Storage Capacitor 1120. Storage Capacitor 1120 is charged during Conversion Period 210 and discharged during Recharge Period 220. As shown in FIG. 12C this discharge from Storage Capacitor 1120 occurs during Recharge Period 220 while Capacitors 120 are being charged.

Figure 13:
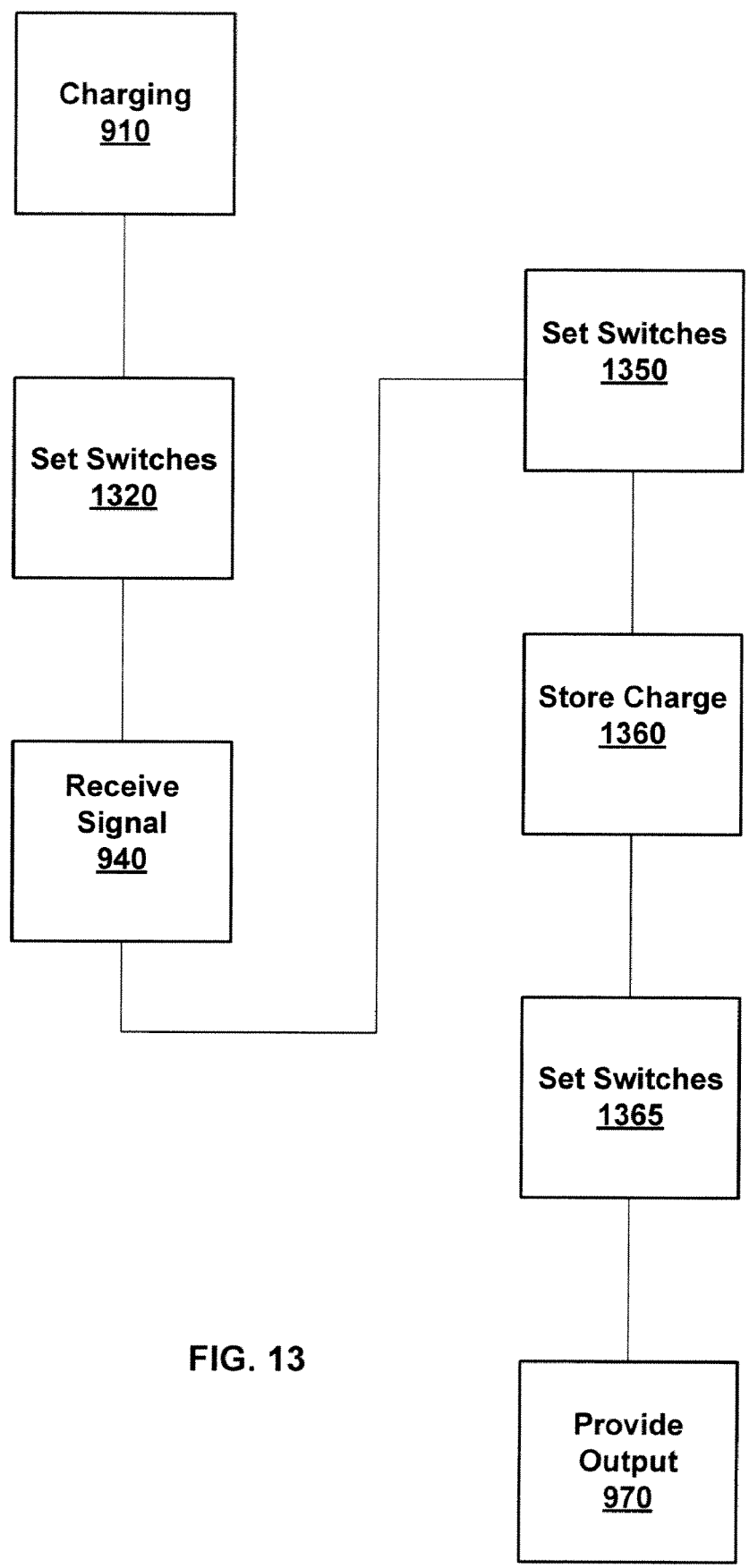
FIG. 13 illustrates methods of converting a digital input signal to an analog output signal, according to various embodiments of the invention.

FIG. 13 illustrates methods of converting a digital input signal to an analog output signal, according to various embodiments of the invention. In these methods Capacitors 120 are selectively charged and discharged responsive to a digital input value. The charge discharged from Capacitors 120 is stored in Storage Capacitor 1120 before being provided as an analog charge output.

In Charging Step 910 Capacitors 120 are charged as discussed elsewhere herein. In a Set Switches Step 1320, Recharge Switches 125 are opened so as to decouple Capacitors 120 from Voltage Source 140. Set Switches Step 1320 may include, for example, Operate Switch Step 920 and Operate Switch Step 930. In Receive Signal Step 940 a signal representing a digital value to be converted to an analog signal is received, as discussed elsewhere herein. Receive Signal Step 940 may occur prior to Charging Step 910 and/or Set Switches Step 1320.

In a Set Switches Step 1350 one or more Discharge Switches 130 are closed so as to discharge Capacitors 120. Set Switches Step 1350 may include, for example, Set Switch Step 950 and Set Switch Step 960. The switches closed in Set Switches Step 1350 are optionally selected based on the digital input value received in Receive Signal Step 940.

In a Store Charge Step 1360 the charge discharged from Capacitors 120 in Set Switches Step 1350 is stored in Storage Capacitor 1120. As is discussed elsewhere herein, in some embodiments Digital-to-Analog Circuit 100 is configured such that Capacitors 120 function as Storage Capacitor 1120. In these embodiments, charge is redistributed among Capacitors 120, e.g., flows between members of Capacitors 120, as a result of Set Switches Step 1350.

In a Set Switches Step 1365 one or more Output Switches 1110 are closed such that the charge stored in Storage Capacitor 1120 can be provided as an analog charge output. This output is optionally differential and is provided in Provide Output Step 970.

The output of Digital-to-Analog Circuit 100 includes a mixture of the frequency content of the digital input signal and a frequency at which sampling occurs. This mixture typically includes two images of the digital input signals as sidebands to the sampling frequency. Digital-to-Analog Circuit 100 is configured to perform both a digital-to-analog conversion and frequency mixing through the same operations. I/Q (in phase plus quadrature phase) modulation is optionally used to suppress one of the two sidebands and provide full power to the other sideband.

Figure 14:
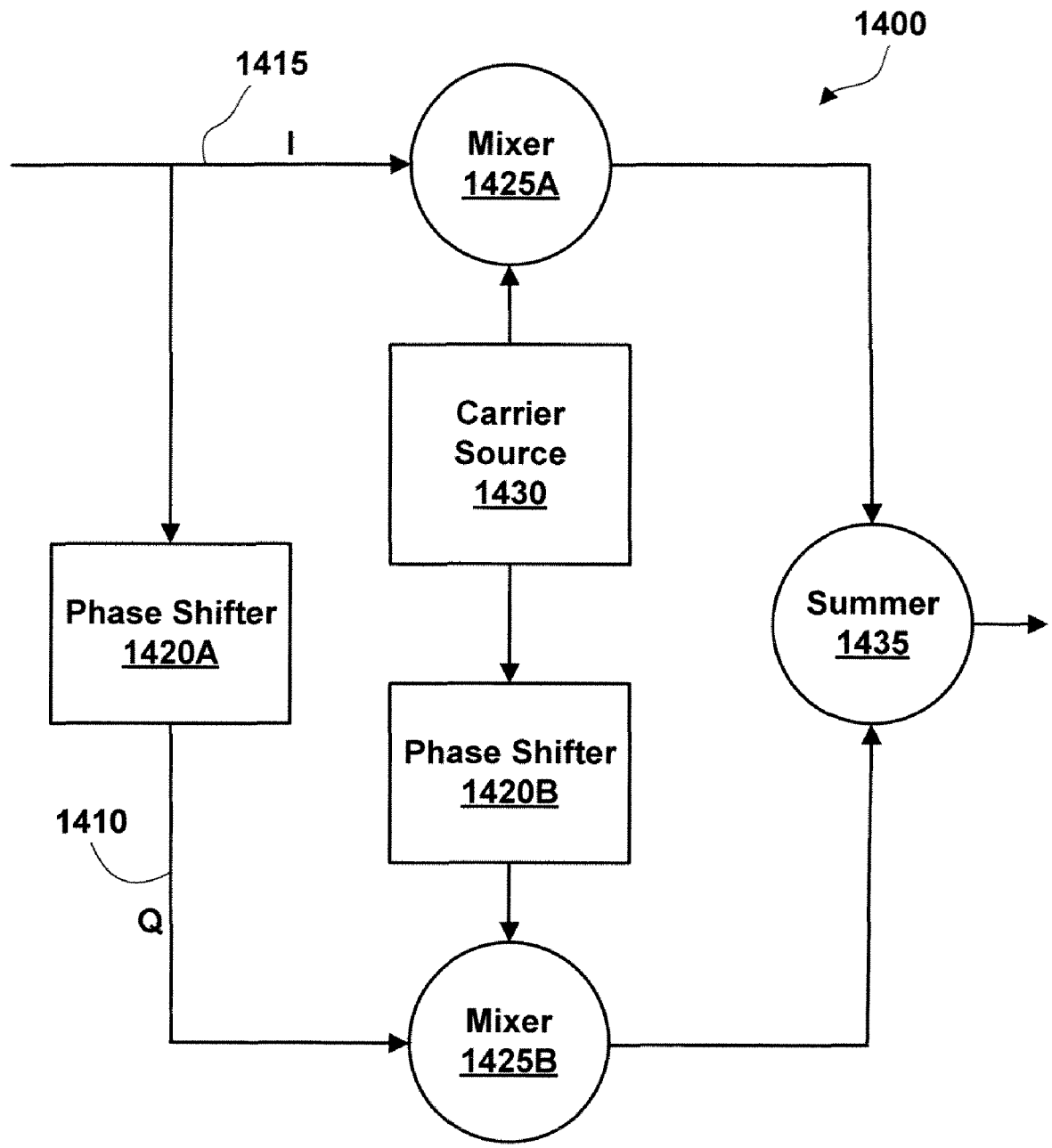
FIG. 14 illustrates an 11Q Modulation System 1400 in configured to suppress one of two sidebands.

FIG. 14 illustrates an I/Q Modulation System 1400 in configured to suppress one of two sidebands. I/Q Modulation System 1400 includes a "Q" Input Path 1410 and an "I" Input Path 1415. These input paths are configured to receive a baseband signal. This baseband signal can include a plurality of signals over a range of frequencies. Input Path 1410 is coupled to a Phase Shifter 1420A configured to apply a 90 degree phase shift to the input signal to produce the "Q" version of the signal. Input Path 1415 is coupled to a Mixer 1425A configured to mix or multiplex two signals. The other input to Mixer 1425A is received from a Carrier Source 1430. Carrier Source 1430 is configured to provide a sinusoidal wave at a carrier frequency. This sinusoidal wave is also provided to a second Phase Shifter 1420B, also configured to apply a 90 degree phase shift. The outputs of Phase Shifter 1420A and Phase Shifter 1420B are mixed in a second Mixer 1425B. The outputs of Mixer 1425A and Mixer 1425B are added in a Summer 1435. This results in a final Output 1440 in which the baseband signal is moved to a higher frequency as a sideband of the carrier frequency. In the prior art sideband suppression systems such as I/Q Modulation System 1400 are typically implemented in the digital domain.

Figure 15A:
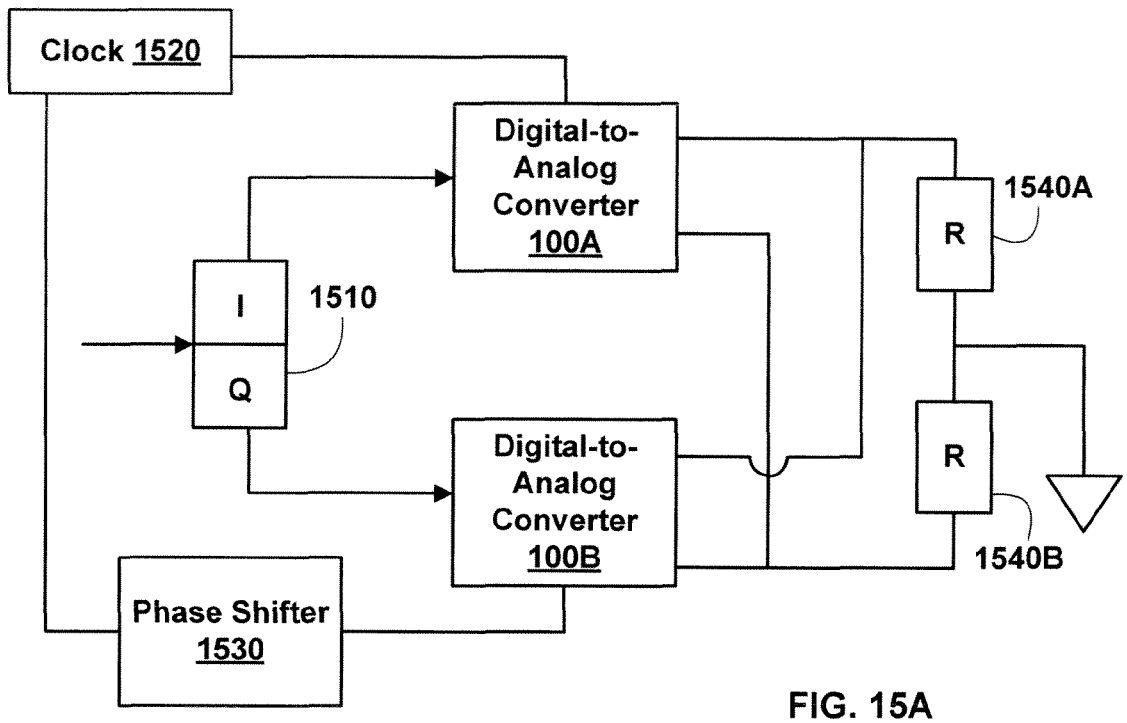
FIGS. 15A and 15B illustrate two alternative circuits in which a digital-to-analog circuit is used to both perform a digital-to-analog conversion and also achieve sideband suppression.
Figure 15B:
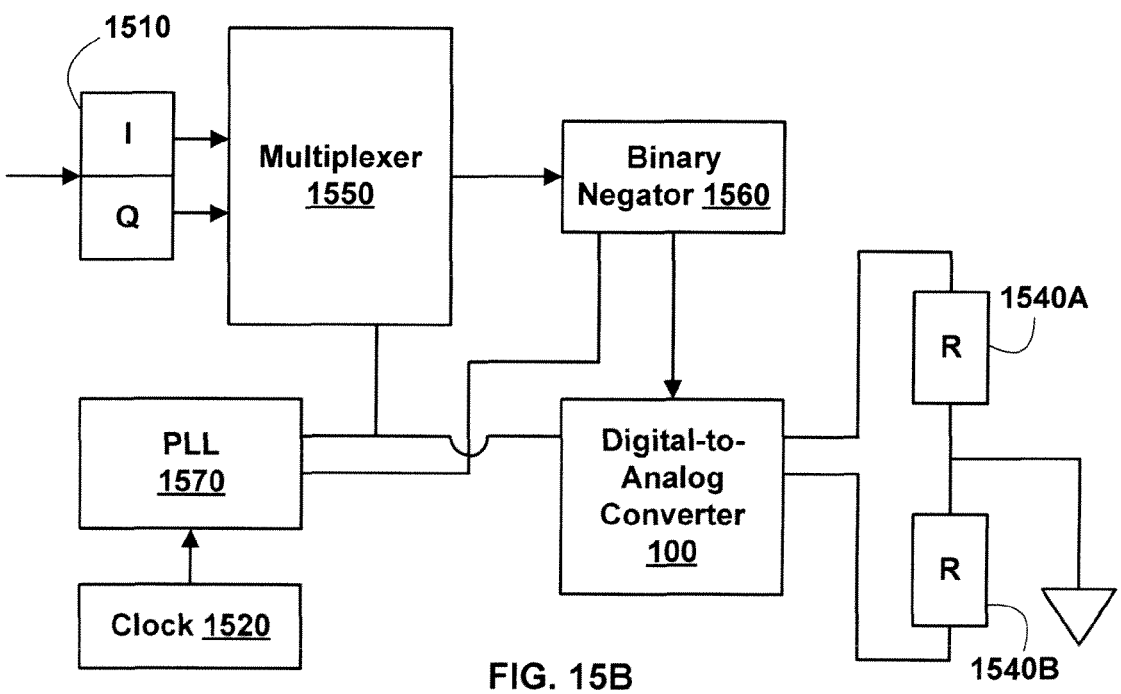

FIGS. 15A and 15B illustrate two alternative circuits in which Digital-to-Analog Circuit 100 is used to both perform a digital-to-analog conversion and also achieve sideband suppression. These circuits produce essentially a single sideband of a carrier frequency from a baseband signal. The carrier frequency is the frequency at which digital-to-analog conversion takes place.

In the circuit of FIG. 15A two Analog-to-Digital Converters, individually labeled 100A and 100B are disposed to receive the "I" and "Q" output of a Data Latch 1510. The "Q" data signal is a phase shifted version of the "I" data signal. The phase shift applied to the "Q" data is:

$$Q_{Phase=2\pi\left[\frac{1}{4}+\frac{f_b}{4f_c}\right]}$$

Where $f_b$ is the frequency of the based band signal and $f_c$ is the frequency of the output of Clock 1520 and $Q_{phase}$ is in radians. Each of Analog-to-Digital Converters 100A and 100B receive a clock signal from a Clock 1520. This clock signal is used to determine the sampling rate and timing of the digital-to-analog conversion. The clock signal received by Digital-to-Analog Converter 100B is shifted 90 degrees using a Phase Shifter 1530. Digital-to-Analog Converter 110A and 100B are optionally configured to produce analog output representative of the digital input for a first half of the clock cycle and to produce an analog output representing a binary negated value of the digital input for a second shelf of the clock cycle. Analog-to-Digital Converters 100A and 100B are each configured to generate a differential output which can be sampled across Loads 1540A and 1540B. Loads 1540A and 1540B are configured to combine the first and second analog outputs so as to produce a single sideband output, e.g., an output in which a second sideband is at least partially suppressed.

In the circuit of FIG. 15B the "I" and "Q" signals are combined in a Multiplexer 1550 and then provided to a Binary Negator 1560. Multiplexer 1550 switches between the "I" and "Q" data inputs half clock cycle. Binary Negator 1560 is configured to negate the multiplexer output on every other clock cycle, e.g. on every odd clock cycle. The output of Binary Negator 1560 is provided to Digital-to-Analog Converter 100. A differential output of Analog-to-Digital Converters 100 is provided to Loads 1540A and 1540B. A PLL 1570 (phase-locked loop) is used to generate two clocks of f and f/2 from a clock 1520. Multiplexer 1550 and Analog-to-Digital Converters 100 receive the output at f while Binary Negator 1560 receives the output at f/2. These outputs are the modulation of the Q and I data modulated by a sine and cosine of the frequency f/2, respectively. The output of Analog-to-Digital Converters 100 is a sideband suppressed signal modulated at half the clock frequency received by Analog-to-Digital Converters 100.

Figure 16:
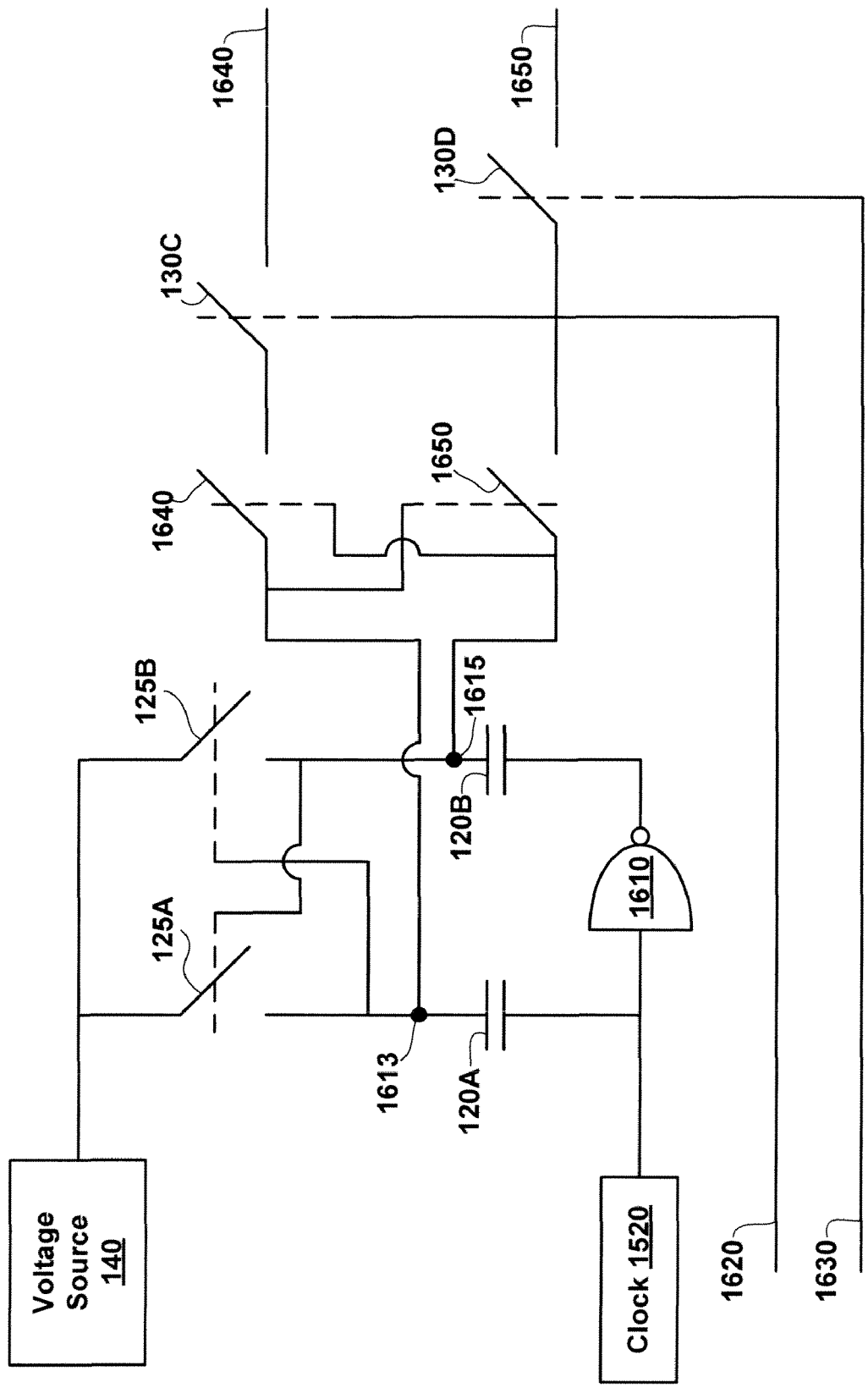
FIG. 16 illustrates an alternative digital-to-analog circuit element, according to various embodiments of the invention.

FIG. 16 illustrates alternative embodiments of Unit Cell 115, according to various embodiments of the invention.

These embodiments include Charging Switch 125A and Charging Switch 125B. Charging Switch 125A and Charging Switch 125B are optionally n-type field effect transistors, the base of Charging Switch 125A being electrically connected to the gate of Charging Switch 125B, and the base of Charging Switch 125B being electrically connected to the gate of Charging Switch 125A. Charging Switch 125A and Charging Switch 125B allow the charging of Capacitors 120A and 120B in alternative clock cycles. The other sides of Capacitors 120A and 120B are electrically connected to an output of Clock 1520. An Inverter 1610 is configured such that Capacitors 120A and 120B receive logically opposite clock signals.

When Capacitor 120A receives a high clock signal a Node 1613 is raised to twice the output of Voltage Source 140 ($2 \times V_{dd}$) and a Node 1615 is lowered in potential by $V_{dd}$ (as a result of the other side of Capacitor 120B being lowered in potential from $V_{dd}$ to 0 by the clock signal). Raising Node 1613 closes Charging Switch 125B and allows Capacitor 120B to be charged to $V_{dd}$ at Node 1615. On the low clock signal Node 1615 is raised to $2 \times V_{dd}$ and Node 1613 is lowered in potential by $V_{dd}$. This closes Charging Switch 125A and allows Capacitor 120A to be charged to $V_{dd}$ at Node 1613. As a result the voltages at Nodes 1613 and 1615 alternate between $V_{dd}$ and 2 times $V_{dd}$ at the frequency of Clock 1520.

A P-Enable Input 1620 and an N-Enable Input 1630 are alternatively used to direct the discharge from Capacitors 120A and 120B to a P-Output 1640 and an N-Output 1650, respectively. The P-Enable Input 1620 is electrically coupled to Discharge Switch 130C and N-Enable Input 1630 is electrically coupled to Discharge Switch 130D. In some embodiments Discharge Switches 130C and 130D are n-type field effect transistors, and P-Enable Input 1620 and an N-Enable Input 1630 are coupled to the gates thereof. A Switch 1640 and a Switch 1650 are configured to assure that the voltage at Nodes 1613 and 1615 does not fall below $V_{dd}$. For example, Switches 1640 and 1650 may be p-type field effect transistors the base of each being electrically coupled to the gate of the other, respectively.

As discussed elsewhere herein, switches such as Recharge Switches 125 and Discharge Switches 130 may include field effect transistors (FETs). The ON resistance of a field effect transistor is dependent on its gate to source voltage. The ON resistance is inversely proportional to the gate-source voltage. Therefore when used in circumstances where the source voltage varies, such as Discharge Switches 130 or Recharge Switches 125 of the various Unit Cell 115 disclosed herein. In these applications the gate-source voltage, and thus the on resistance, can change over time. This reduces the efficiency of the circuit.

Figure 17:
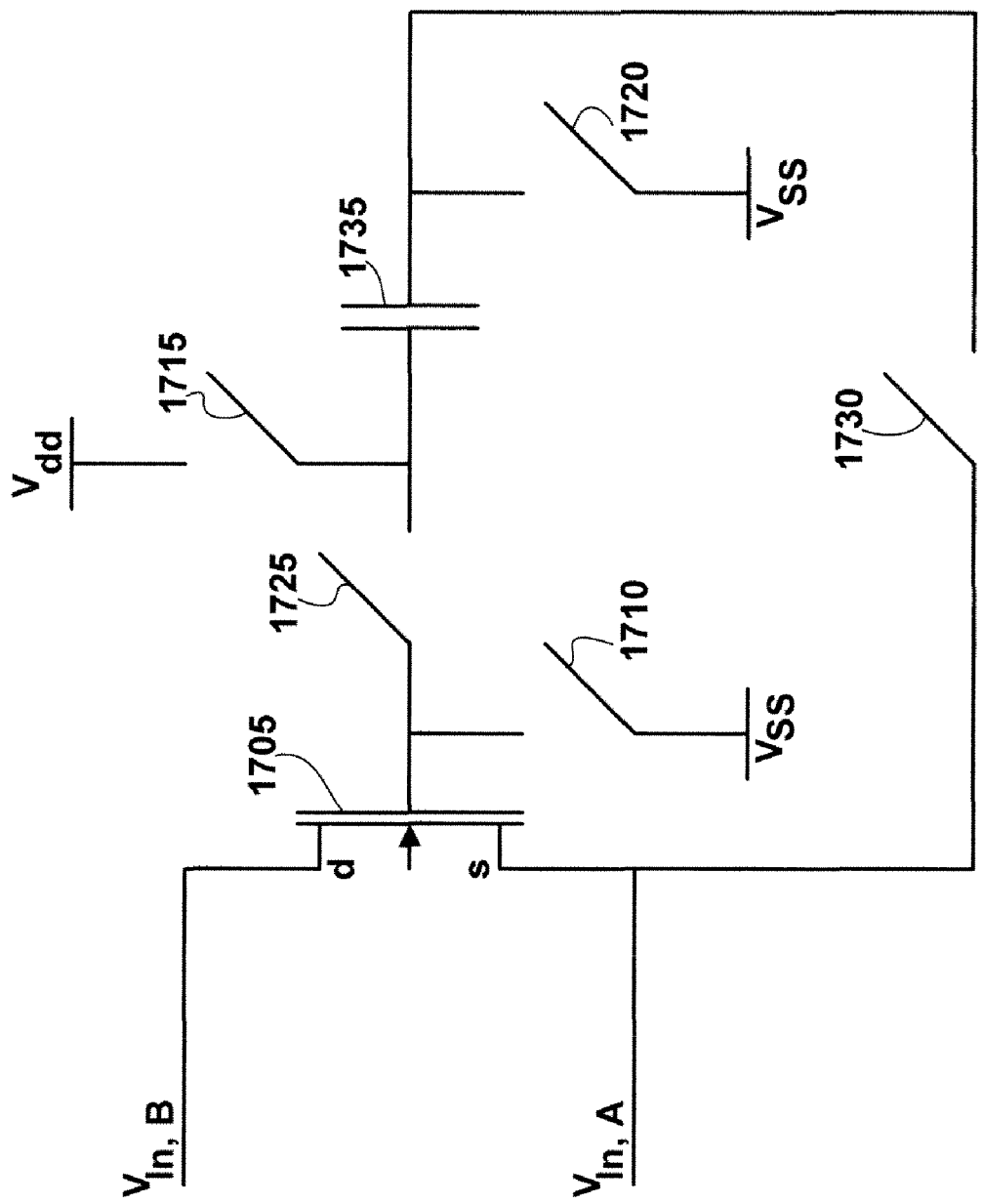
FIG. 17 illustrates an example of a bootstrapped switch, according to various embodiments of the invention.

In order to overcome this problem, the switches discussed herein are optionally bootstrapped to achieve an ON resistance that is essentially independent of source voltage. FIG. 17 illustrates an example of a bootstrapped switch as may be included in various embodiments of the invention.

The resistance between a source (s) and drain (d) of a FET 1705 is kept constant in the ON state by keeping the gate-source voltage a constant value of $V_{dd}-V_{ss}$. In the OFF state of FET 1705, Switches 1710, 1715 and 1720 are closed while Switches 1725 and 1730 are open. This switch setting will turn FET 1705 off assuming that $V_{in,A}$ does not drop below $V_{ss}$. This switch setting will also charge Capacitor 1735 to $V_{dd}-V_{ss}$. In the ON state of FET 1705, Switches 1725 and 1730 are closed while Switches 1710, 1715 and 1720 are open. This switch setting applies the charge on Capacitor 1735 between the gate and source of FET 1705. Specifically, the gate-source voltage will be $V_{dd}-V_{ss}$ and the gate voltage will be $(V_{dd}-V_{ss})+V_{in,A}$. The gate—source voltage is independent of the source voltage and the resistance through FET 1705 will be approximately constant in the ON state as the source voltage varies. Switches 1710, 1715, 1720, 1725 and 1730 optionally include transistors.

Several embodiments are specifically illustrated and/or described herein. However, it will be appreciated that modifications and variations are covered by the above teachings and within the scope of the appended claims without departing from the spirit and intended scope thereof. For example the digital-to-analog circuit described herein may be used on systems and applications other than the transmitter system of FIG. 8. The circuits described herein are optionally implemented in CMOS integrated circuits. The voltage sources discussed are meant to include current sources or combinations of voltages sources and current sources, in addition to devices that one of ordinary skill in the art would consider voltage sources.

In some embodiments of the invention, Control Circuit 135 is configured to close Recharge Switches 125 during Recharge Period 220 and to close Discharge Switches 130 during Conversion Period 210, independent of a digital value to be converted. In these embodiments an additional set of discharge switches (not shown) is configured to selectively discharge a subset of Capacitors 120, e.g., to ground, after Recharge Period 220 and before Conversion Period 210. This subset is selected responsive to the digital input value using Digital Input Circuit 105. During Conversion Period 210 those Capacitors 120 that were not previously discharged, i.e., not members of the selected subset, provide charge through Discharge Switches 130 to Output Circuit 110. The Output Circuit 110 illustrated by FIG. 11C is optionally used with these embodiments.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

The invention claimed is:

1. A radio frequency transmitter comprising:
    a control circuit configured to produce a digital control signal;
    a data latch configured to receive a digital data signal in a first frequency band and to store the digital data signal according to timing of the digital control signal;
    a digital-to-analog converter configured to receive the digital data signal from the data latch and to generate a differential output signal modulated to form a second frequency of at least 0.8 GHz, the output signal comprising a series of pulses including charge representative of the digital data;
    a band selection filter configured to receive the output signal of the digital-to-analog converter;
    an amplifier configured to amplify the output signal of the digital-to-analog converter; and
    a coupler configured to receive the output signal of the digital-to-analog converter and to couple this output signal to a communication medium at the second frequency.

2. The radio frequency transmitter of claim 1, wherein the second frequency is within a side band of a mixture of the first frequency band and a sampling frequency of the digital-to-analog converter.

3. The radio frequency transmitter of claim 1, wherein the second frequency is approximately 1.5 GHz or between approximately 1.5 and 2 GHz.

4. The radio frequency transmitter of claim 1, wherein the second frequency is between 2 GHz and 3.2 GHz.

5. The radio frequency transmitter of claim 1, wherein the second frequency includes a frequency band at least 50 MHz in width.

6. The radio frequency transmitter system of claim 1, wherein the filter and the amplifier are disposed such that the output signal of the digital-to-analog converter is passed through the filter and then through the amplifier before being received by the coupler.

7. The radio frequency transmitter system of claim 1, wherein filter and the amplifier are disposed such that the output signal of the digital-to-analog converter is passed through the amplifier and then through the filter before being received by the coupler.

8. The radio frequency transmitter system of claim 1, wherein the coupler includes an antenna, a current follower, a transformer, a diplexer or a balan.

9. The radio frequency transmitter system of claim 1, wherein the output signal at the second frequency is generated by the digital-to-analog conversion process without requiring further mixing.

10. The radio frequency transmitter system of claim 1, wherein the output signal of the digital-to-analog converter includes dual sidebands around a sampling frequency of the digital-to-analog converter.

11. A method for converting a digital input signal to an analog output signal by a radio frequency transmitter comprising:
producing, by a control circuit, a digital control signal;
receiving, at a data latch, a digital data signal in a first frequency band;
storing, by the data latch, the digital data signal according to timing of the digital control signal;
receiving, by a digital-to-analog converter, the digital data signal from the data latch;
generating, by the digital-to-analog converter, a differential output signal modulated to form a second frequency of at least 0.8 GHz, the output signal comprising a series of pulses including charge representative of the digital data;
filtering, by a band selection filter, the output signal of the digital-to-analog converter;
amplifying, by an amplifier, the output signal of the digital-to-analog converter; and
coupling, by a coupler, the output signal to a communication medium at the second frequency.

12. The method of claim 11, wherein the second frequency is within a side band of a mixture of the first frequency band and a sampling frequency of the digital-to-analog converter.

13. The method of claim 11, wherein the second frequency is approximately 1.5 GHz or between approximately 1.5 and 2 GHz.

14. The method of claim 11, wherein the second frequency is between 2 GHz and 3.2 GHz.

15. The method of claim 11, wherein the second frequency includes a frequency band at least 50 MHz in width.

16. The method of claim 11, wherein the filter and the amplifier are disposed such that the output signal of the digital-to-analog converter is passed through the filter and then through the amplifier before being received by the coupler.

17. The method of claim 11, wherein filter and the amplifier are disposed such that the output signal of the digital-to-analog converter is passed through the amplifier and then through the filter before being received by the coupler.

18. The method of claim 11, wherein the coupler includes an antenna, a current follower, a transformer, a diplexer or a balan.

19. The method of claim 11, wherein the output signal at the second frequency is generated by the digital-to-analog conversion process without requiring further mixing.

20. The method of claim 11, wherein the output signal of the digital-to-analog converter includes dual sidebands around a sampling frequency of the digital-to-analog converter.

* * * * *